(12) United States Patent
Bruce et al.

(10) Patent No.: US 7,826,243 B2
(45) Date of Patent: Nov. 2, 2010

(54) MULTIPLE CHIP MODULE AND PACKAGE STACKING FOR STORAGE DEVICES

(75) Inventors: Rey Bruce, San Jose, CA (US); Ricardo Bruce, Union City, CA (US); Patrick Digamon Bugayong, Mandaluyong (PH); Joel Alonzo Baylon, Cavite (PH)

(73) Assignee: BiTMICRO Networks, Inc., Fremont, CA (US)

( * ) Notice: Subject to any disclaimer, the term of this patent is extended or adjusted under 35 U.S.C. 154(b) by 747 days.

(21) Appl. No.: 11/322,442

(22) Filed: Dec. 29, 2005

(65) Prior Publication Data

US 2007/0158808 A1    Jul. 12, 2007

(51) Int. Cl.
G11C 5/02    (2006.01)
(52) U.S. Cl. .................. 365/51; 257/686; 257/777; 365/63; 365/230.03; 365/230.05
(58) Field of Classification Search .............. 257/686, 257/777; 365/51, 63, 230.03, 230.05
See application file for complete search history.

(56) References Cited

U.S. PATENT DOCUMENTS

| | | | |
|---|---|---|---|
| 5,854,507 A | | 12/1998 | Miremadi et al. |
| 5,995,379 A | * | 11/1999 | Kyougoku et al. .......... 361/803 |
| 6,172,874 B1 | | 1/2001 | Bartilson |
| 6,381,141 B2 | * | 4/2002 | Corisis et al. ............... 361/735 |
| 6,392,896 B1 | | 5/2002 | Stoller |
| 6,469,375 B2 | * | 10/2002 | Beausoleil et al. .......... 257/686 |
| 6,624,506 B2 | * | 9/2003 | Sasaki et al. ................ 257/686 |
| 6,900,528 B2 | | 5/2005 | Mess et al. |
| 6,991,947 B1 | * | 1/2006 | Gheewala ..................... 438/15 |
| 7,098,541 B2 | * | 8/2006 | Adelmann ................... 257/777 |
| 7,212,422 B2 | * | 5/2007 | Koide ............................ 365/51 |
| 7,352,602 B2 | * | 4/2008 | Janzen ........................ 365/63 |

FOREIGN PATENT DOCUMENTS

WO    9406210 A1    3/1994

OTHER PUBLICATIONS

Jeffrey C. Demmin, Novel 3-D Packaging Approaches Simplifying the Assembly and Test Supply Chain, Business Briefing: Global Semiconductor Manufacturing Technology, 2003, pp. 1-5.
Moody Dreiza, Akito Yoshida, Jonathan Micksch and Lee Smith, Stacked Package-on-Package Design Guidelines, Chip Scale Review, Jul. 2005, pp. 1-4, Reprinted by Amkor Technology, Inc. Chandler, Arizona.
ISA/US (Blaine Copenheaver), International Search Report and Written Opinion for International Application No. PCT/US06/62747, nine pages.

* cited by examiner

*Primary Examiner*—Dang T Nguyen
*Assistant Examiner*—Alexander Sofocleous
(74) *Attorney, Agent, or Firm*—Uriarte Law

(57) ABSTRACT

Stacking techniques are illustrated in example embodiments of the present invention wherein semiconductor dies are mounted in a module to become a MCM which serves as the basic building block. A combination of these modules and dies in a substrate creates a package with specific function or a range of memory capacity. Several example system configurations are provided using BGA and PGA to illustrate the stacking technique. Several pin assignment and signal routing techniques are illustrated wherein internal and external signals are routed from main board to various stacked modules. Expansion can be done both on the vertical and horizontal orientations.

15 Claims, 28 Drawing Sheets

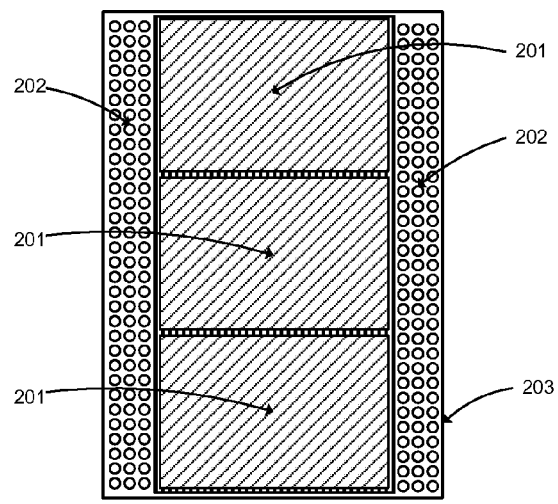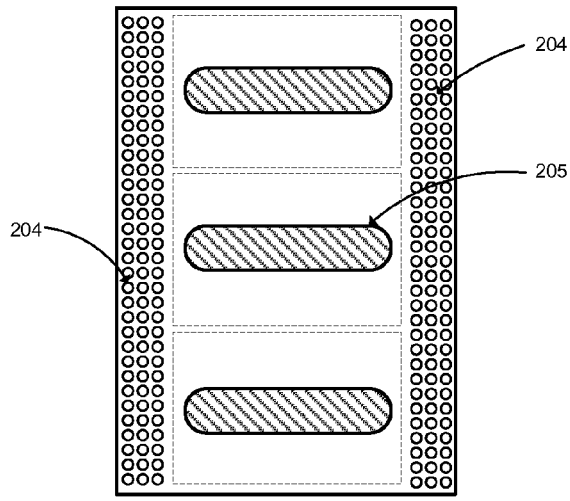
Figure 2a
Figure 2b
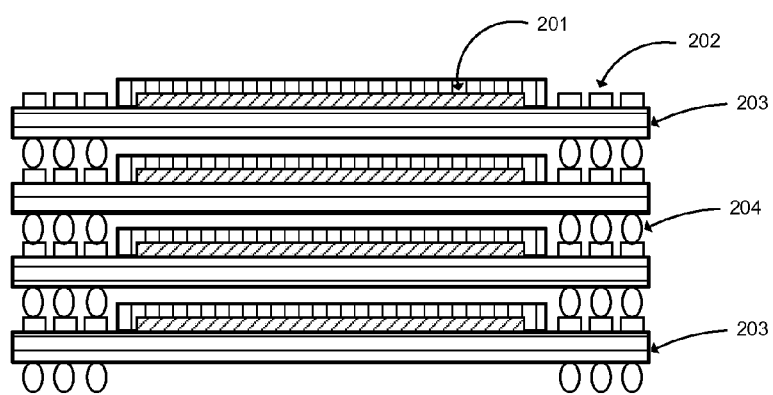
Figure 2c

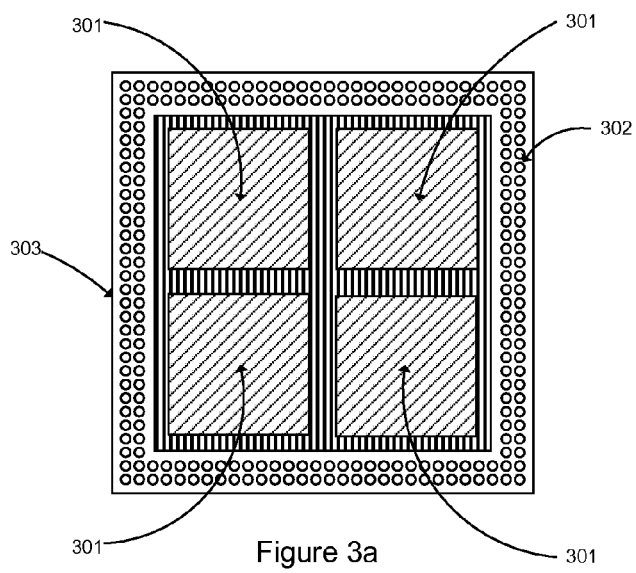
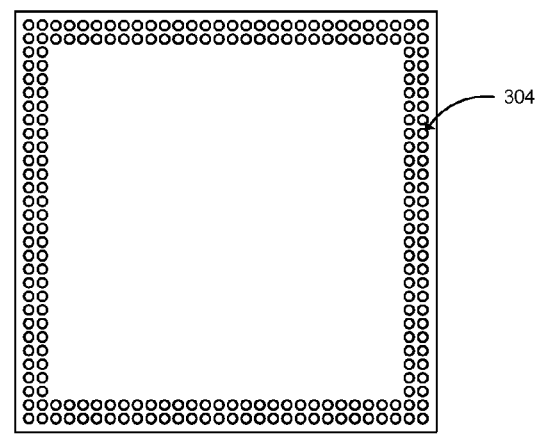
Figure 3a     Figure 3b
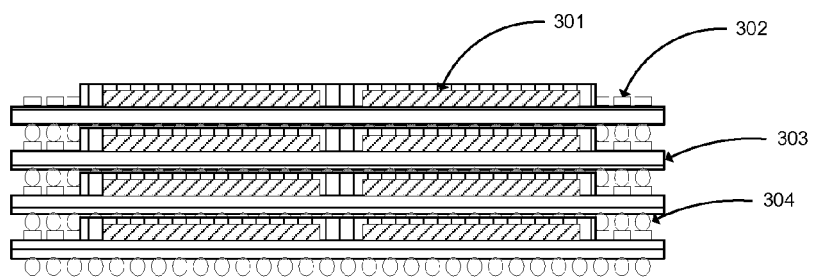
Figure 3c

MULTIPLE CHIP MODULE AND PACKAGE STACKING FOR STORAGE DEVICES

BACKGROUND

1. Field

The present invention relates to computer systems. More particularly, the present invention relates to flash memory based semiconductor disk drives and a method of using multiple chip module (MCM) and Package Stacking technique to support miniaturization and memory scalability.

2. Description of Related Art

A flash memory based semiconductor disk drive typically use separate packages for the interface controller, the DMA controller, the processor and separate packages for the Flash devices, the FPROMs and the RAMs. This current method limits the miniaturization of the entire storage device. In order to achieve the move to miniaturization, chip modules and packages need to be stacked. Stacking both on chip module and package level maximizes the capacity in a limited area thus realizing the move to miniaturize the entire storage device. A technique in stacking chip modules and packages strategically to support miniaturization and memory scalability in both vertical and horizontal orientation is therefore proposed.

SUMMARY OF THE INVENTION

In the stacking technique illustrated in example embodiments of the present invention, semiconductor dies are mounted in a module to become a MCM which serves as the basic building block. Combination of these modules and dies in a substrate creates a package with specific function or a range of memory capacity. These packages are stacked to increase capacity or add functions. A combination of different existing technology such as flip chip, wire bond, MCM, module stacking, advance packaging, etc. are used to accomplish highly reliable module to module and package to package interconnection and scalability. A single package can have a wide range of capacity depending on the memory capacity of the die used and the number of modules stacked within the package. In the proposed package stacking technique, the stacked modules in a package serve as the building blocks for the package level stacking. Multiple packages are stacked to create the desired memory capacity and different packages are stacked to create desired function. Expansion can be done both on the vertical and horizontal orientations. The technique is in the assignment of pins. Small capacity miniature storage devices can use the vertical expansion, while high capacity devices with larger form factors can use both vertical and horizontal expansion to maximize capacity. By using this technique, large capacity storage devices are implemented in a small package device, and larger form factors achieve bigger memory capacities.

The present invention takes advantage of the existing stacking technology both on the module and package level. This maximizes the capacity in a small area, realizing the miniaturization transition. Modular approach is used in creating basic building blocks which can be tested individually and replaced easily prior to final packaging, making the technique reliable, and cost effective. A wide range of capacity can be configured through variation of die capacities and stacking modules and/or packages. Expanding capacity may be implemented vertically, horizontally or both, depending on board area and desired capacity.

BRIEF DESCRIPTION OF DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the present invention may admit to other equally effective embodiments.

FIG. 2a, 2b, 2c depict the SDRAM module's top and bottom drawings and a cross sectional representation of stacked multiple SDRAM modules according to an example embodiment of the present invention.

FIG. 3a, 3b, 3c depict the flash module's top and bottom drawings and a cross sectional representation of stacked multiple flash modules according to an example embodiment of the present invention.

FIG. 5a, 5b depict the memory module's top and bottom drawings according to an example embodiment of the present invention.

DETAILED DESCRIPTION OF THE INVENTION

Figure 1A:
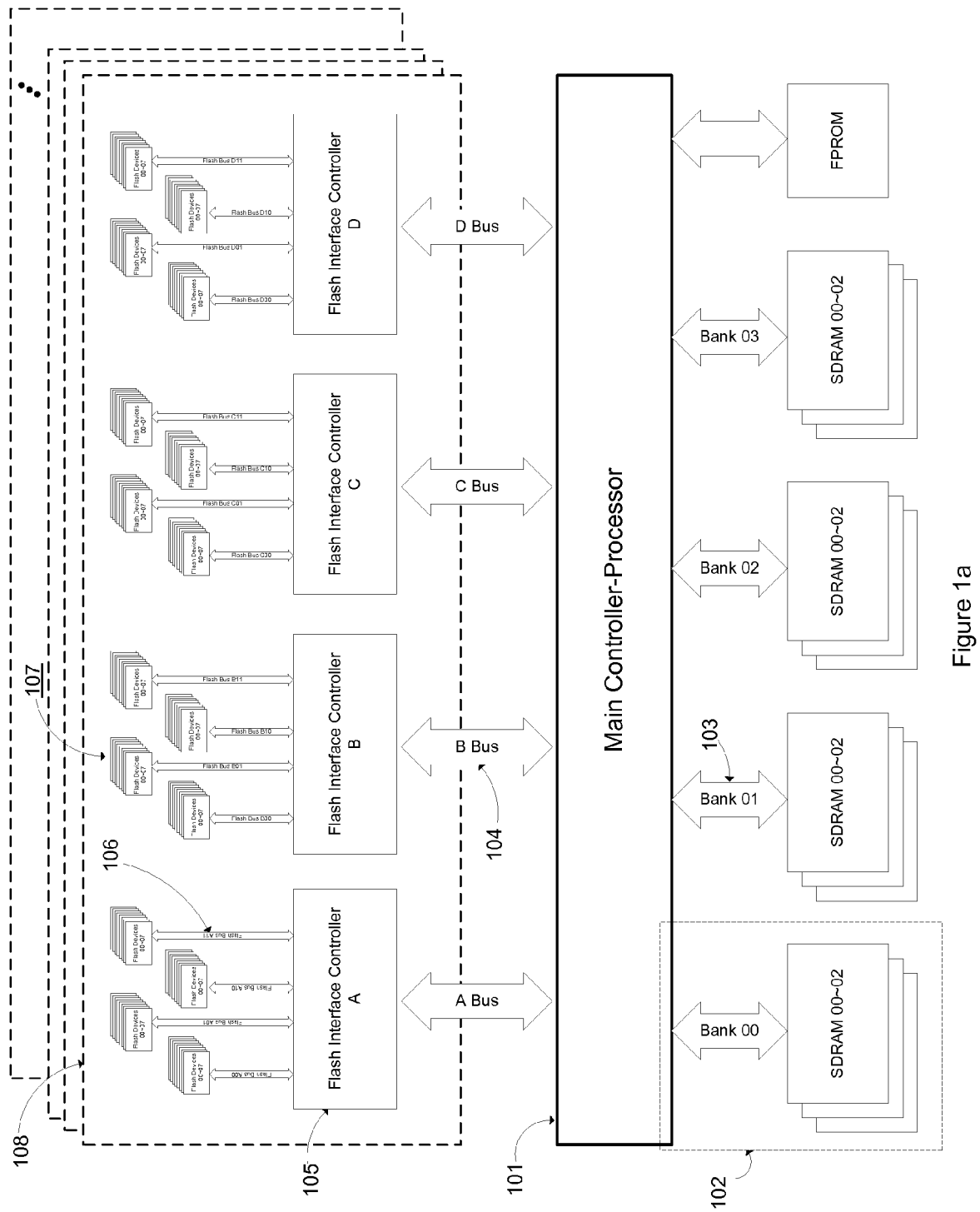
FIG. 1a shows the block diagram of the stackable system for high performance, high capacity devices according to an example embodiment of the present invention.

FIG. 1a is a block diagram of a flash storage system according to a first example embodiment of the present invention. The block diagram shows the entire high-end system that is modularized, stacked, and packaged to achieve the desired features of the technique. The heart of the system is the main controller-processor 101 which interfaces with the flash memory, the flash PROM and the SDRAM memory blocks. The SDRAM is configured from a single bank 102 to a maximum of four banks depending on the desired capacity. Each bank such as 102 includes 3 SDRAMs. The flash devices such as 107 are controlled by the Flash Interface Controller such as 105. Each controller supports four flash buses such as flash bus A11 106, and each flash bus supports a maximum of 8 flash devices. The main controller-processor supports four flash interface controllers through 4 different busses such as B bus 104. The four flash interface controllers with their corresponding flash devices comprise the memory set 108. The main controller-processor can support from one memory set to a maximum of 15 memory sets. This is a maximum support of 1,920 flash devices.

Figure 1B:
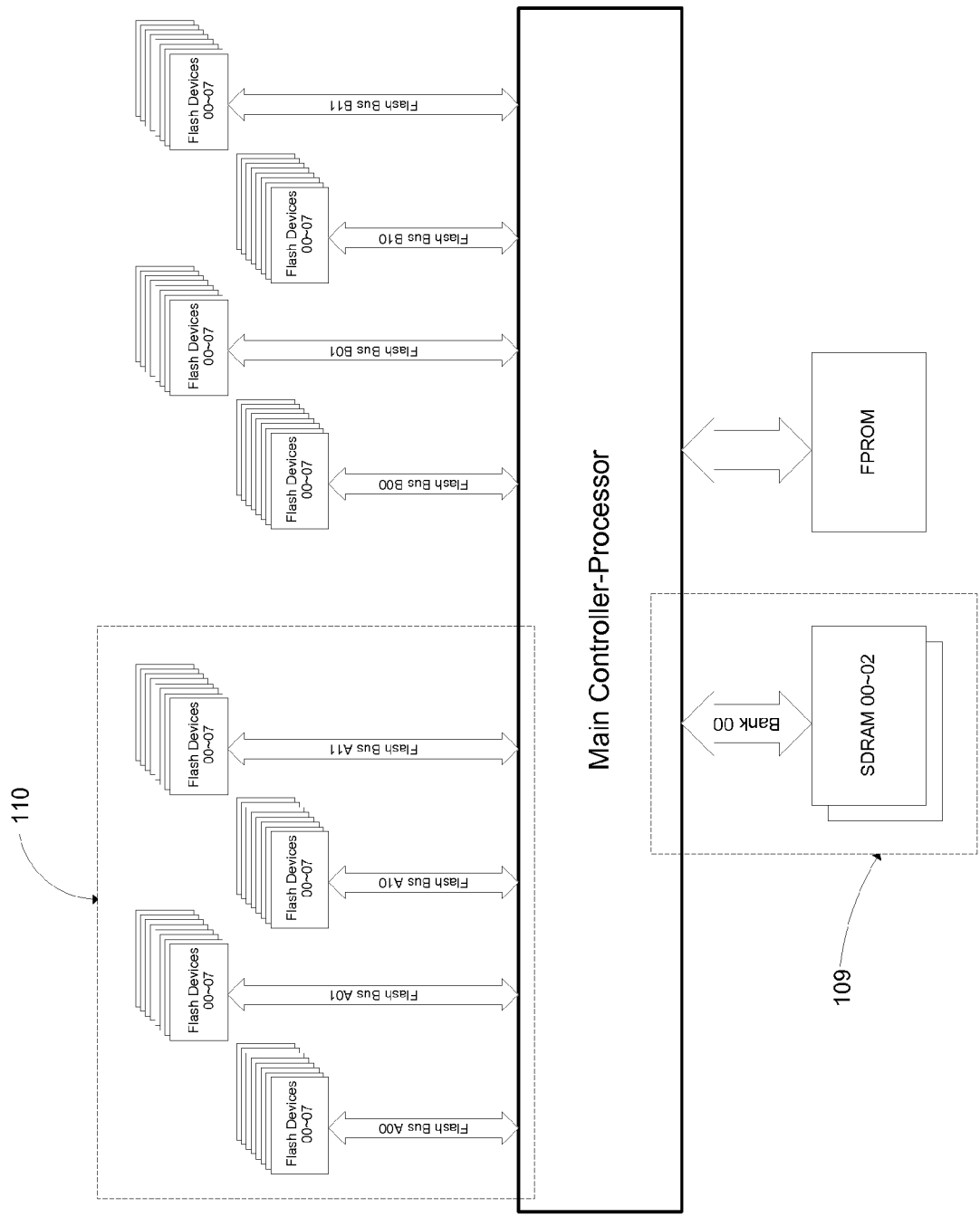
FIG. 1b shows the block diagram of the stackable system for lower performance, lower capacity devices according to an example embodiment of the present invention.

FIG. 1b is a block diagram of a flash storage system according to a second example embodiment of the present invention. The block diagram shows the entire low-end system that is modularized, stacked, and packaged to achieve the desired features of the technique. Since a low-end system may not require a large amount of memory capacity, SDRAM may be limited to one bank 109, or none at all, and the supported flash devices may also be limited to only two sets of flash buses. One set of flash buses 110 consists of four flash bus with 8 flash devices supported per flash bus, which results in a maximum supported number of 64 flash devices.

From the basic dies; SDRAM, FPROM, flash memory, flash interface controller, and the main controller-processor, single and multiple chip modules are created to become the basic building blocks for the stacking technique presented in the present invention. Referring to FIG. 2a which is a top view of an SDRAM module, three SDRAM dies 201 are placed in a single substrate 203 to become the SDRAM module which is one of the basic building blocks. The SDRAM module is represented in FIG. 1 as a single bank 102 composed of SDRAM 00, SDRAM 01, and SDRAM 02 connected to the SDRAM interface 103. All signals needed to interface to the controller module and other SDRAM modules are assigned in both the bottom balls 204 and top pads 202 respectively. Bottom balls 204 are shown in FIG. 2b which is a bottom view of the SDRAM module, three slots 205 are created under the SDRAM die's pad attach area to accommodate bottom wire bonding. FIG. 2c is the stacked module cross sectional representation. Top pads 202 and bottom balls 204 act as the vertical interconnects between all SDRAM modules and to the controller module. Varying the SDRAM die capacity and the stack quantity, results in wide range of total SDRAM capacity depending on the product application. The SDRAM device organization, capacity and bank limitations are defined by the main controller-processor's SDRAM interface specifications. The main controller-processor intended to be used for this example embodiment of the present invention supports a 32-bit wide 4 banks maximum SDRAM configuration.

FIG. 3a is a top view that shows four flash dies 301 in a single substrate 303 that collectively form part of a flash module, which can also function as a basic building block. All signals needed to interface with the memory module and other flash modules are assigned in both the bottom balls 304 and the top pads 302, respectively, as shown in FIGS. 3a, 3b and 3c. In FIG. 3c, the flash modules are stacked. Maximum stack quantity depends on the flash interface controller specifications. Top pads 302 and bottom balls 304 acts as the vertical interconnects between stacked flash modules and to the memory module. Varying the flash die capacity and the stacking quantity, results in a wide range of total flash capacity depending on the product application and capacity requirements. The flash device organization and capacity limitations are defined by the flash interface controller's specifications. The flash interface controller intended to be used for this used for this example embodiment of the present invention supports 8 flash devices per flash bus, thus allowing a maximum stacking of 8 flash modules.

Figure 4A:
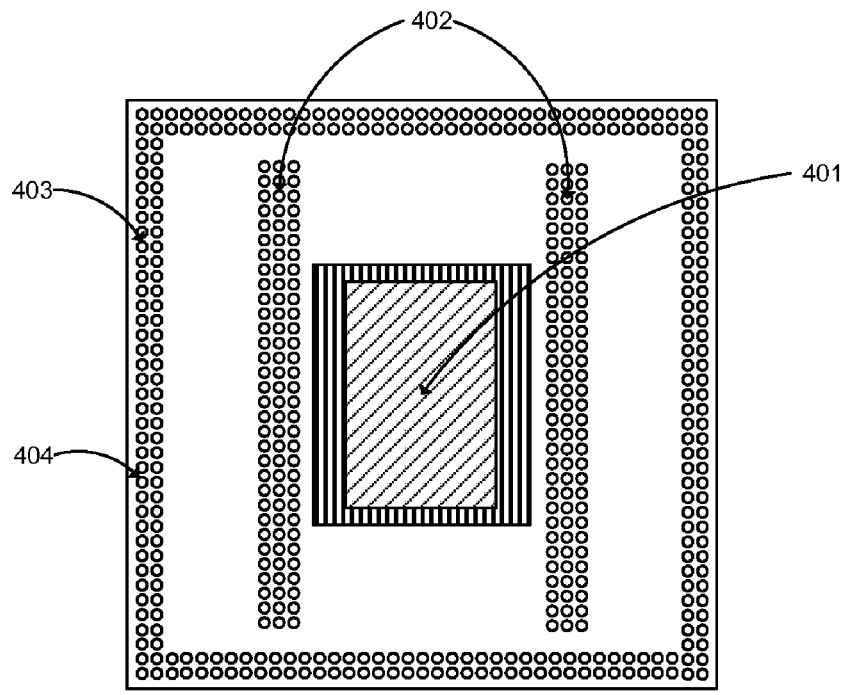
FIG. 4a, 4b depict the first high-end controller module's top and bottom drawings according to an example embodiment of the present invention.

FIG. 4a shows the top view of the first example embodiment of the present invention illustrated in a first high-end controller module configuration. A single FPROM die 401 is placed at the center of the substrate 404. Pads are composed of two sections, one for the SDRAM module interface shown as 402 and another for the memory module interface shown as

Figure 4B:
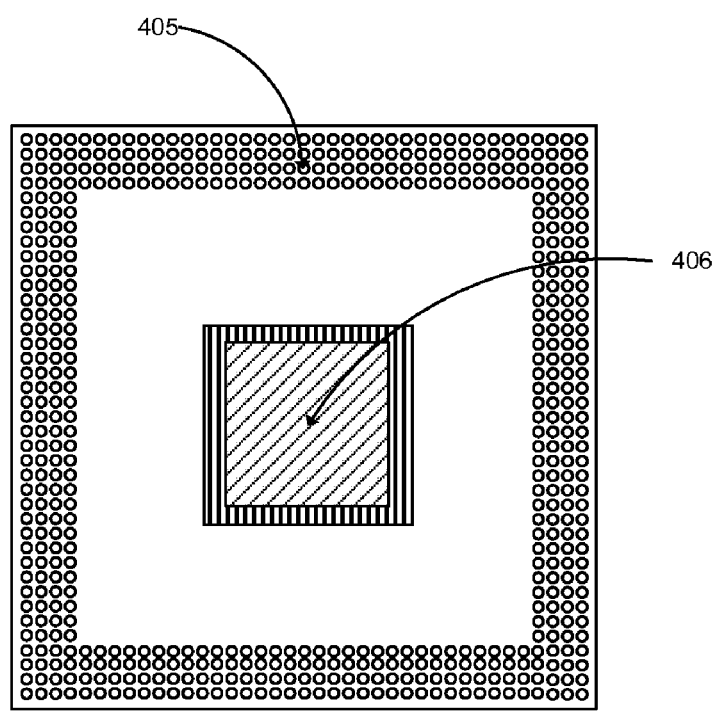

403. This technique enables multiple stacking of both SDRAM modules and memory modules in a single package. FIG. 4b shows the bottom view of the controller module. A single main controller-processor die 406 is placed at the center of the substrate. The controller module becomes a base module for the package. The balls 405 are used to connect to the main substrate which is typically a printed circuit board (PCB).

Figure 5A:
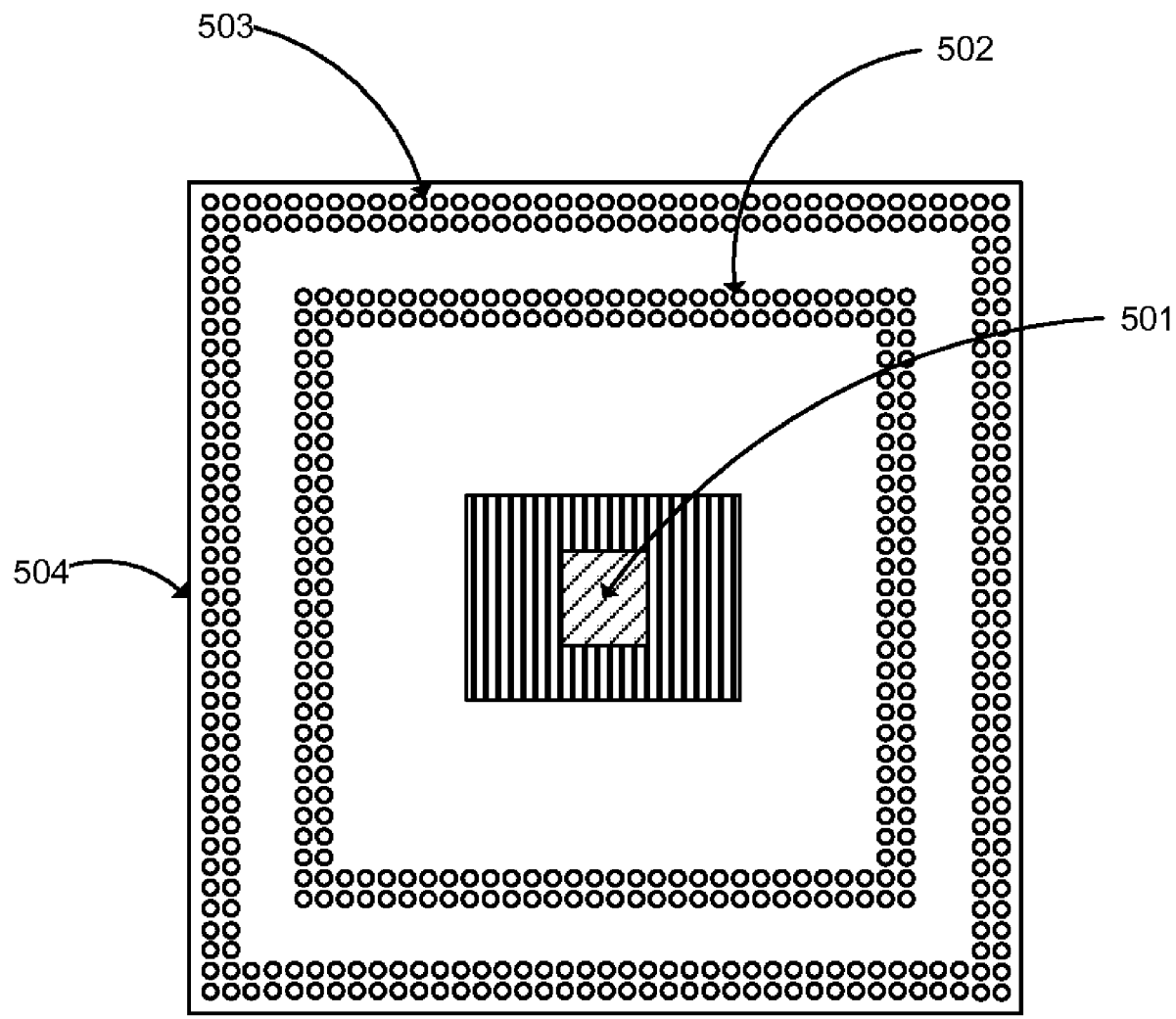

FIG. 5a shows the top view of the memory module which is also a basic building block. A single flash interface controller die 501 is placed on the center of the substrate 504. Pads are composed of two sections, one for the flash module interface shown as 502 and another for the other memory module interface shown as 503. This technique enables multiple stacking of flash modules and memory modules in a single package. The memory module becomes a base module for the package. FIG. 5b shows the bottom view of the memory module. The memory module balls 505 are used to connect to the main substrate PCB, to the controller modules or to the other memory modules depending on the type of configuration desired.

Figure 6A:
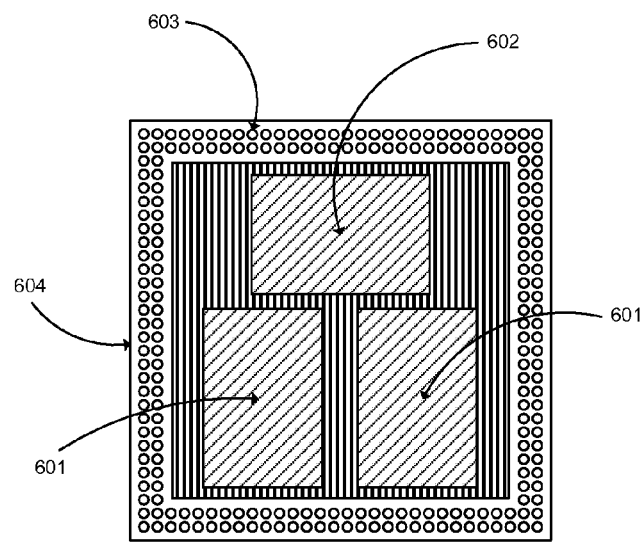
FIG. 6a, 6b depict the first low-end controller module's top and bottom drawings according to an example embodiment of the present invention.
Figure 6B:
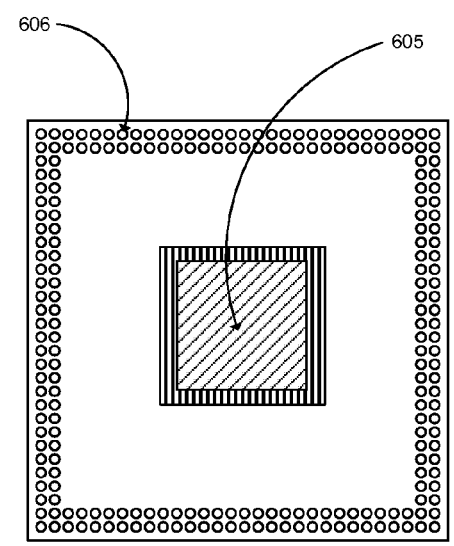

FIG. 6a shows the top view of the second example embodiment of the present invention illustrated in a first low-end controller module configuration. Two SDRAMs 601 and a single FPROM 602 are placed on top of the module. This configuration is flexible. The SDRAMs can be unpopulated in a low performance application. Internal SRAMs in the main controller-processor will take over the SDRAM functions. The main controller-processor 605 is placed at the bottom of the module. This configuration does not allow stacking of the SDRAM which is not necessary for low capacity applications. Flash modules are stacked on top, interfacing to the pads 603. The substrate 604 is the same size as the flash module making its final package smaller. The bottom balls 606 are used to interface with the main PCB.

Figure 7A:
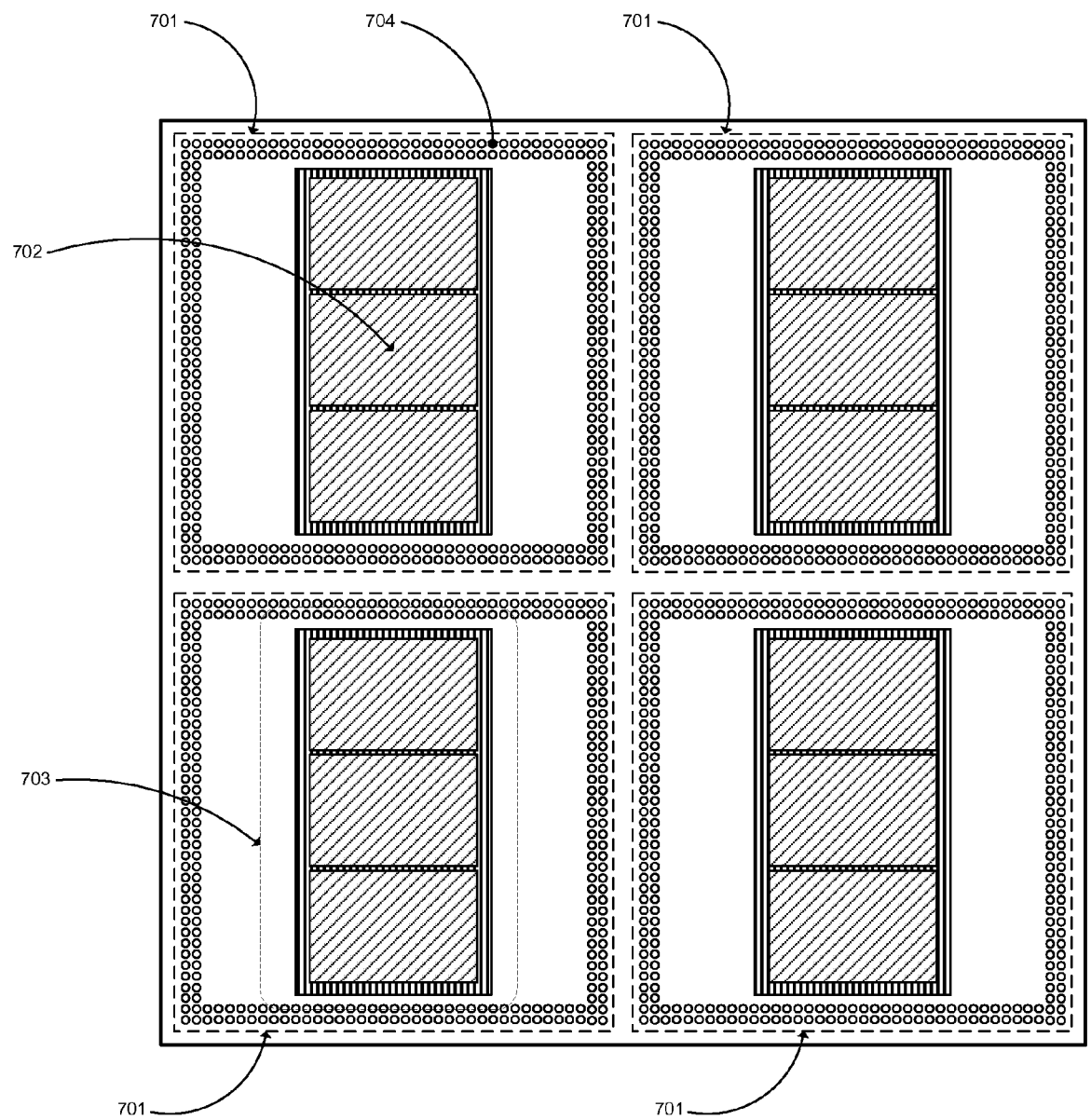
FIG. 7a, 7b depict the second high-end controller module's top and bottom drawings according to an example embodiment of the present invention.
Figure 7B:
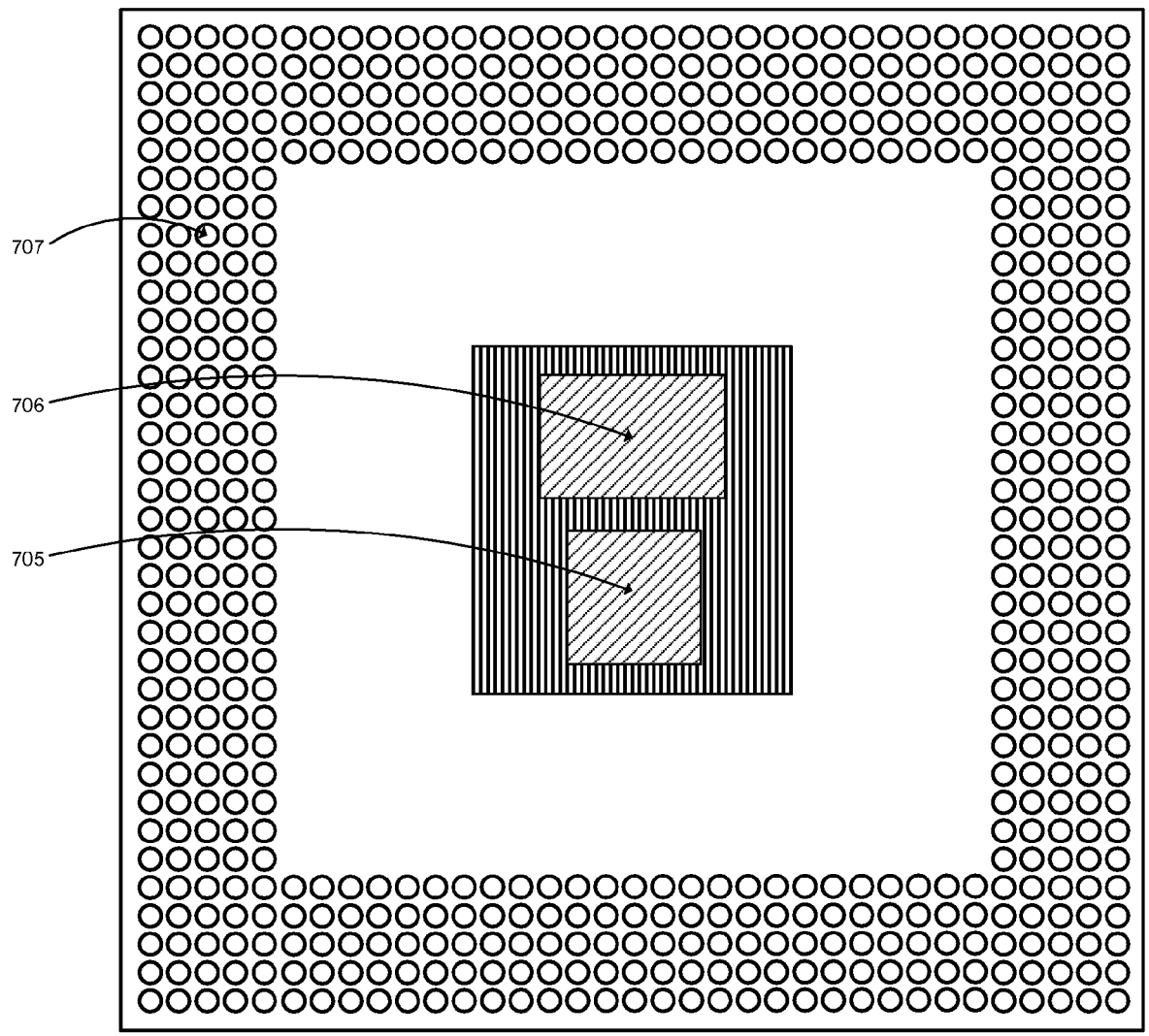

FIG. 7a shows the top view of the first example embodiment of the present invention illustrated in a second high-end controller module configuration, where four memory modules 701 can be mounted on separate locations adjacent to each other. Memory module interface pads 704 are allocated for multiple stack configurations. In the middle of the memory module interface pads, 3 SDRAM dies 702 are mounted. Each area corresponds to one SDRAM bank 703, totaling to a maximum of 4 SDRAM banks in the package. The bottom view is presented in FIG. 7b, where the main controller-processor die 705 and the FPROM die 706 are mounted adjacent to each other. The module's balls 707 are used for external interface to the main PCB.

Figure 8A:
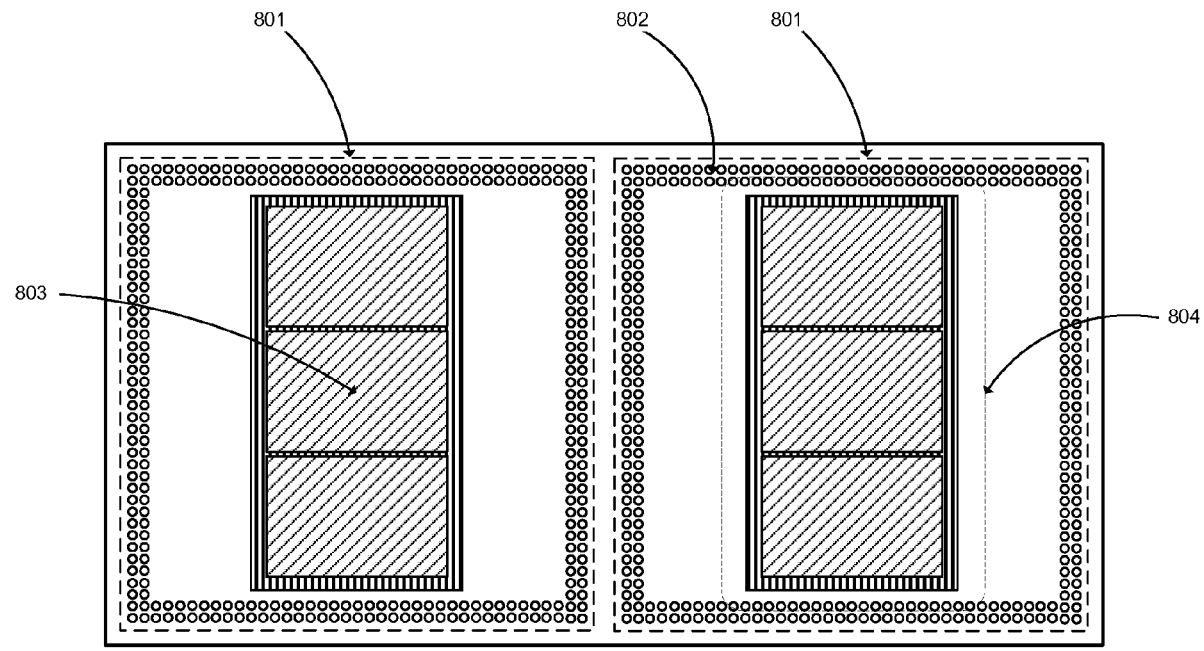
FIG. 8a, 8b depict the second low-end controller module's top and bottom drawings according to an example embodiment of the present invention.
Figure 8B:
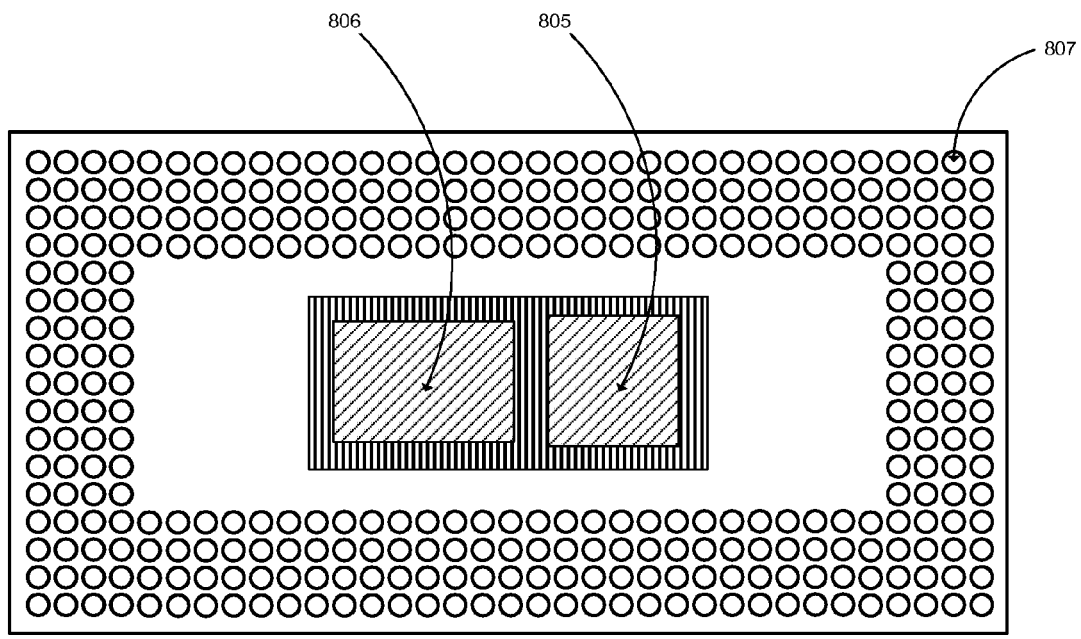

FIG. 8a shows the top view of the second example embodiment of the present invention illustrated in a second low-end controller module configuration, where only two memory modules 801 can be mounted side-by-side. Memory module interface pads 802 are allocated for multiple stacking configurations. In the middle of the memory module interface pads, 3 SDRAM dies 803 are mounted. Each area corresponds to one SDRAM bank 804, totaling to only a maximum of 2 SDRAM banks in a package. The SDRAM can either be mounted or not depending on the application. Internal SRAMs can also be used instead of the SDRAMs. The stacked memory modules can also be configured to support both internal and external flash interface controller applications. The bottom view is presented in FIG. 8b, where the main controller-processor die 805 and the FPROM die 806 are mounted adjacent to each other. The module balls 807 are used for external interface to the main PCB.

Figure 9:
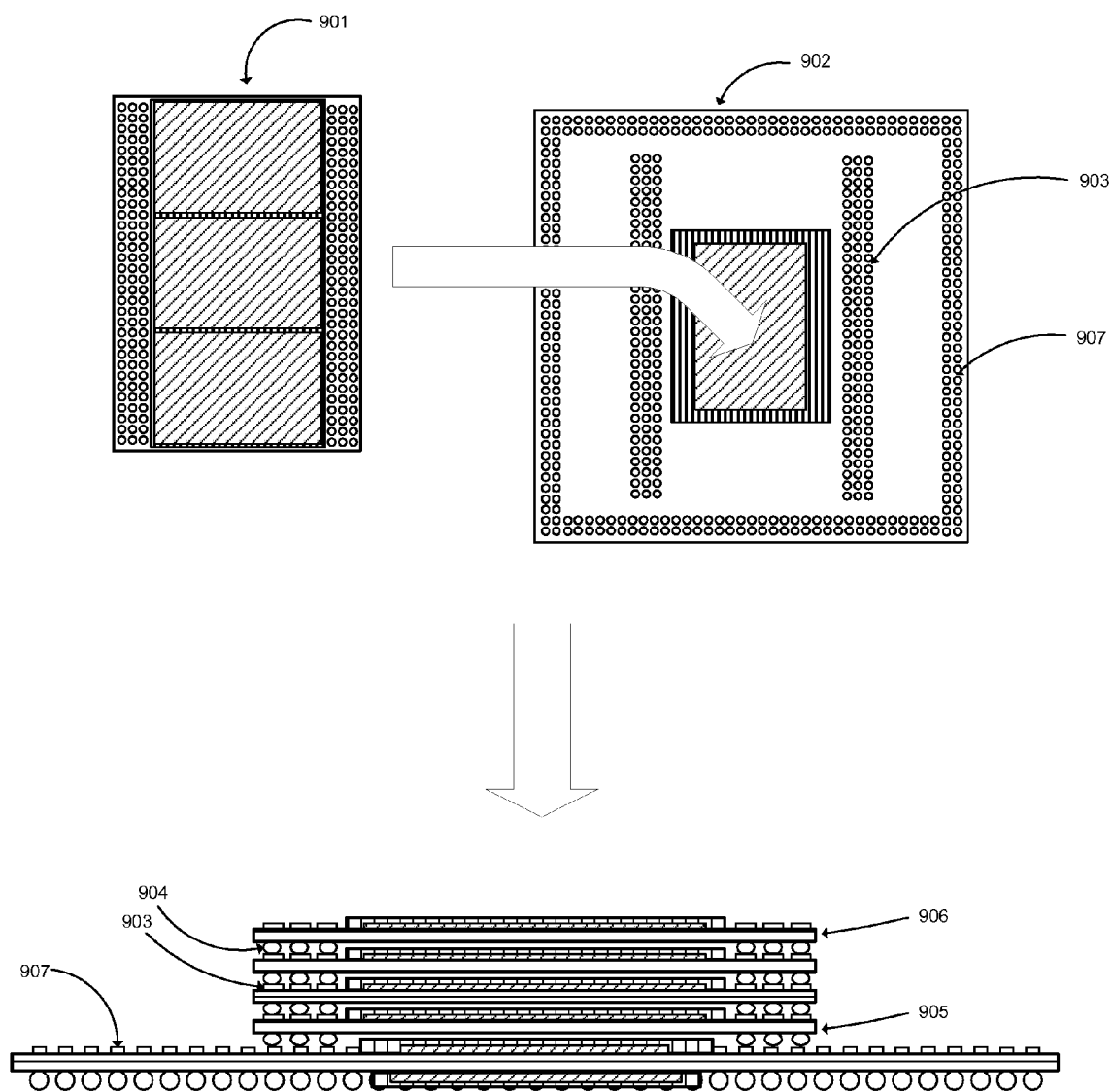
FIG. 9 depicts the stacked SDRAM modules further stacked on the controller module according to an example embodiment of the present invention. This configuration is used for high end applications. The figure also shows how the balls have corresponding pads for inter-module connection.

FIG. 9 shows the stacking of SDRAM module 901 and controller module 902. A single or stacked SDRAM module can be placed on top of a controller module. The pads for the SDRAM module interface 903 must align with the SDRAM module balls 904. The bottom-most SDRAM module 905 serves as bank 0, and the top-most module 906 serves as bank 3. For low capacity SDRAM requirements, only a single or dual bank is enough. High capacity devices needs to have a maximum SDRAM capacity, thus stacking the maximum of 4 modules. The outer pads 907 are for the memory module interface.

Figure 10:
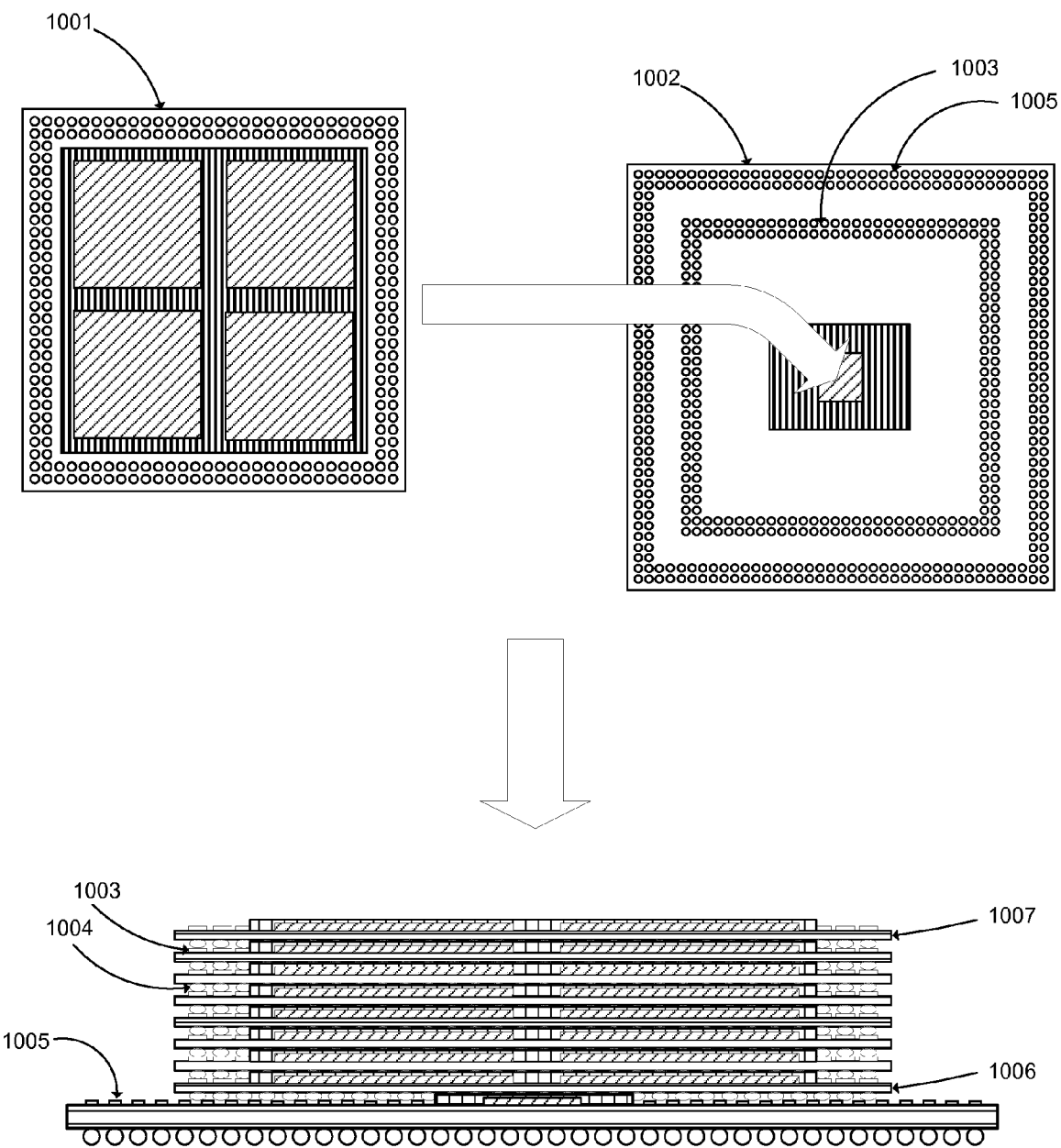
FIG. 10 depicts stacked flash modules further stacked on the memory module according to an example embodiment of the present invention. The figure also shows how the balls have corresponding pads for inter-module connection.

FIG. 10 shows the stacking of flash modules 1001 and memory module 1002. A four-stack or eight-stack flash module is placed on top of a memory module. The pads for the flash module interface 1003 must align with the flash module balls 1004. The outer pads 1005 are for other memory module interface. The flash interface controller intended to be used for this example embodiment of the present invention supports a maximum of 4 flash buses and each flash bus supports a maximum of 8 flash devices. The bottom-most flash module 1006 contains the 4 flash buses' Flash 00 devices and the top-most module 1007 contains the 4 flash buses' Flash 07 devices.

Figure 11:
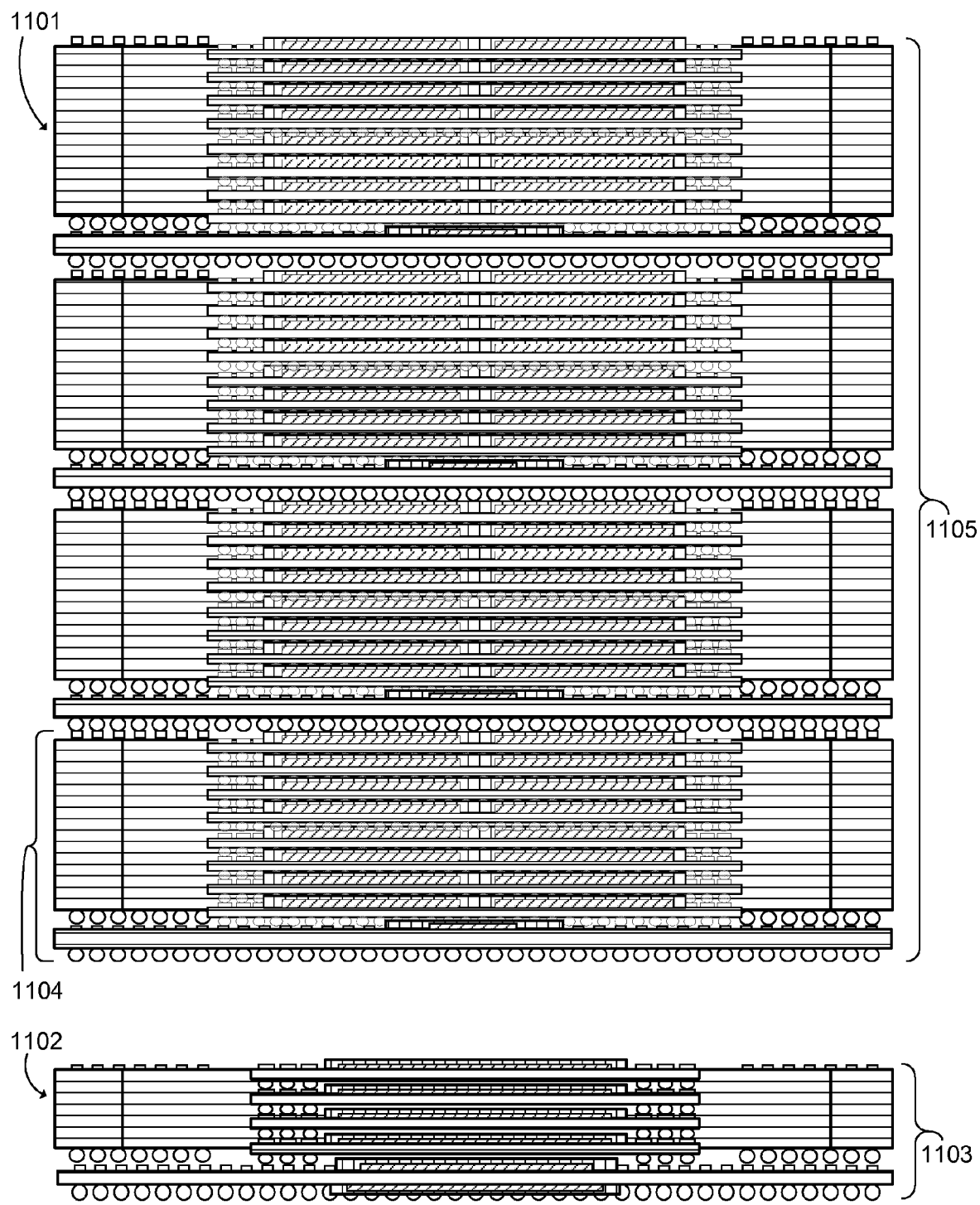
FIG. 11 depicts the possible stacking options for the first high-end controller module and the memory modules according to an example embodiment of the present invention. A substrate interface is used to attach one group of stacked modules to another.

FIG. 11 shows a sample of a maximized stacking technique that can be configured through vertical, horizontal or combined expansion. Multiple staking will increase the overall height of the module, thus requiring a filler 1101 to physically interconnect two stacked modules. A thinner filler 1102 may be used depending on the height differential between the modules which is dependent to the number of stacks applied. A controller module with the stacked SDRAM modules act as the controller package 1103. A memory module with stacked flash modules acts as the memory package 1104. Four memory packages stacked together form the memory set 1105. Vertical expansion happens when the controller package is stacked with a single or multiple memory sets. The figure shows a single memory set to be stacked to the controller package. Horizontal expansion happens when the controller package is located on a different site on the PCB relative to the memory sets. Also multiple memory sets can be located on different sites on a PCB. Combo expansion happens when both vertical and horizontal expansion technique is implemented simultaneously. The expansion technique is very flexible depending on the desired memory capacity, main PCB size limitations and also height limitations.

Figure 12A:
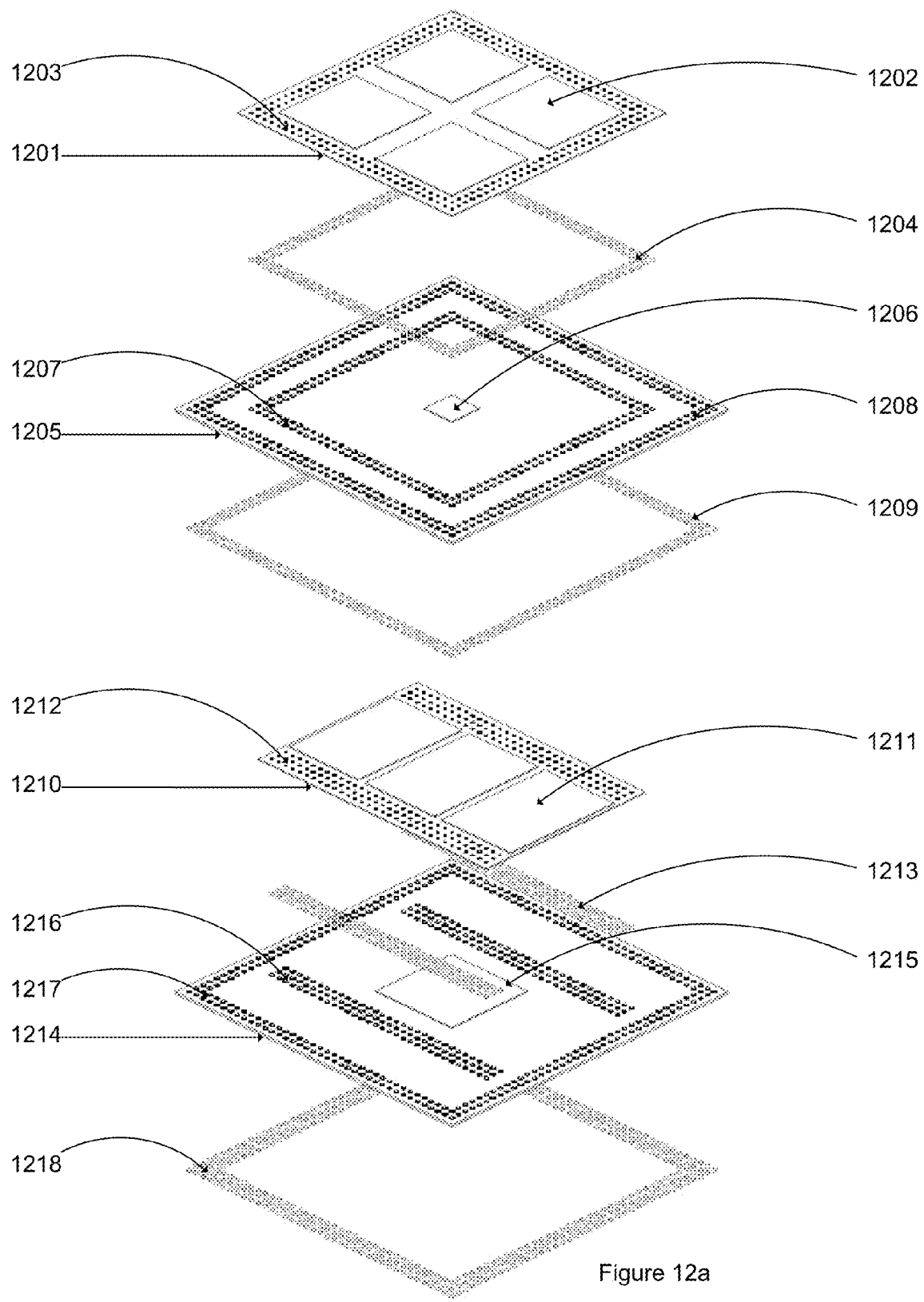
FIG. 12a is an isometric exploded drawing of the stacking technique presented in FIG. 11 according to an example embodiment of the present invention. Multiple identical stacking is not included in this drawing.

FIG. 12a shows the isometric and exploded drawing of the stacking technique for the first high-end controller configuration. Pins are assigned strategically and modules are stacked to make possible the miniaturization of the entire system in a package.

Figure 12B:
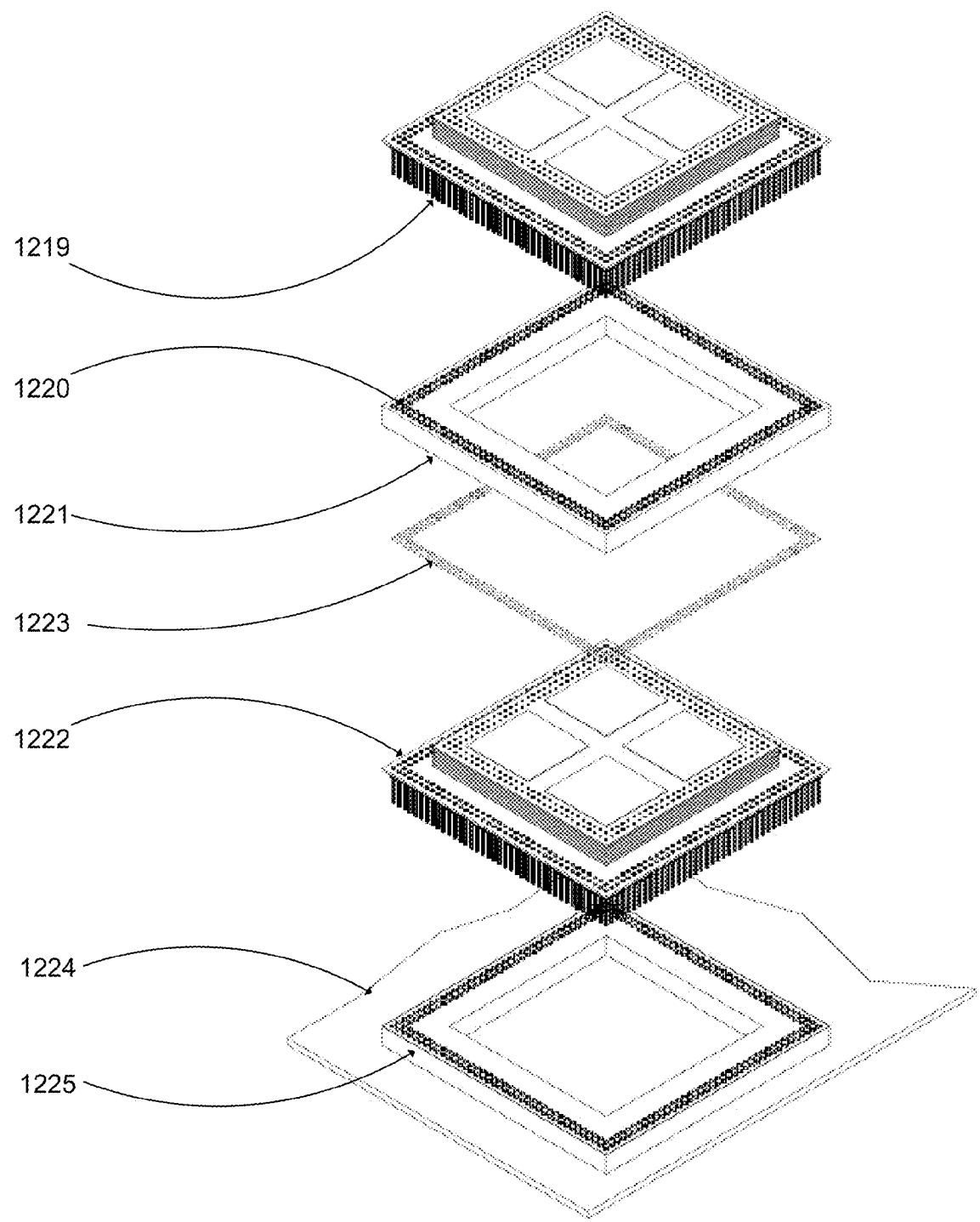
FIG. 12b is another package stacking technique using Pin Grid Array (PGA) rather than Ball Grid Array (BGA) according to an example embodiment of the present invention. This is used for easy replacement and expansion.

1201—The Flash Module
1202—The Flash Die
1203—The Flash Module Pad Interface to other Flash Modules
1204—The Flash Module Solder Balls
1205—The Memory Module
1206—The Flash Interface Controller Die
1207—The Memory Module Pad Interface for the Flash Module
1208—The Memory Module Pad Interface for the other Memory Modules
1209—The Memory Module Solder Balls
1210—The SDRAM Module
1211—The SDRAM Die
1212—The SDRAM Module Pad Interface to other SDRAM Modules
1213—The SDRAM Module Solder Balls
1214—The Controller Module 1215—The FPROM Die on top side and the Main Controller-Processor Die at the bottom side.
1216—The Controller Module Pad Interface to the SDRAM Modules
1217—The Controller Module Pad Interface to the Memory Modules
1218—The Controller Module Solder Balls FIG. 12b is another technique used in this invention to ease replacement and facilitate expansion. Instead of using Ball Grid Array (BGA), Pin Grid Array (PGA) 1219 is used. This method makes it more flexible due to the technology's inherent feature where replacement is done swiftly without any assembly process involved. Horizontal expansion is also benefited in this technology. The figure shows the stacked memory module as an example. The memory module is packaged using the PGA technology, where the top portion of the package becomes the socket 1220 and the bottom portion the pin arrays 1219. The filler 1221 becomes the package's top socket and is interfaced into the base module 1222 through the BGA 1223. The base module uses PGA to interface to the bottom package or to the main board 1224. Filler 1225 is also mounted into the main board to interface the stacked memory modules.

Figure 13:
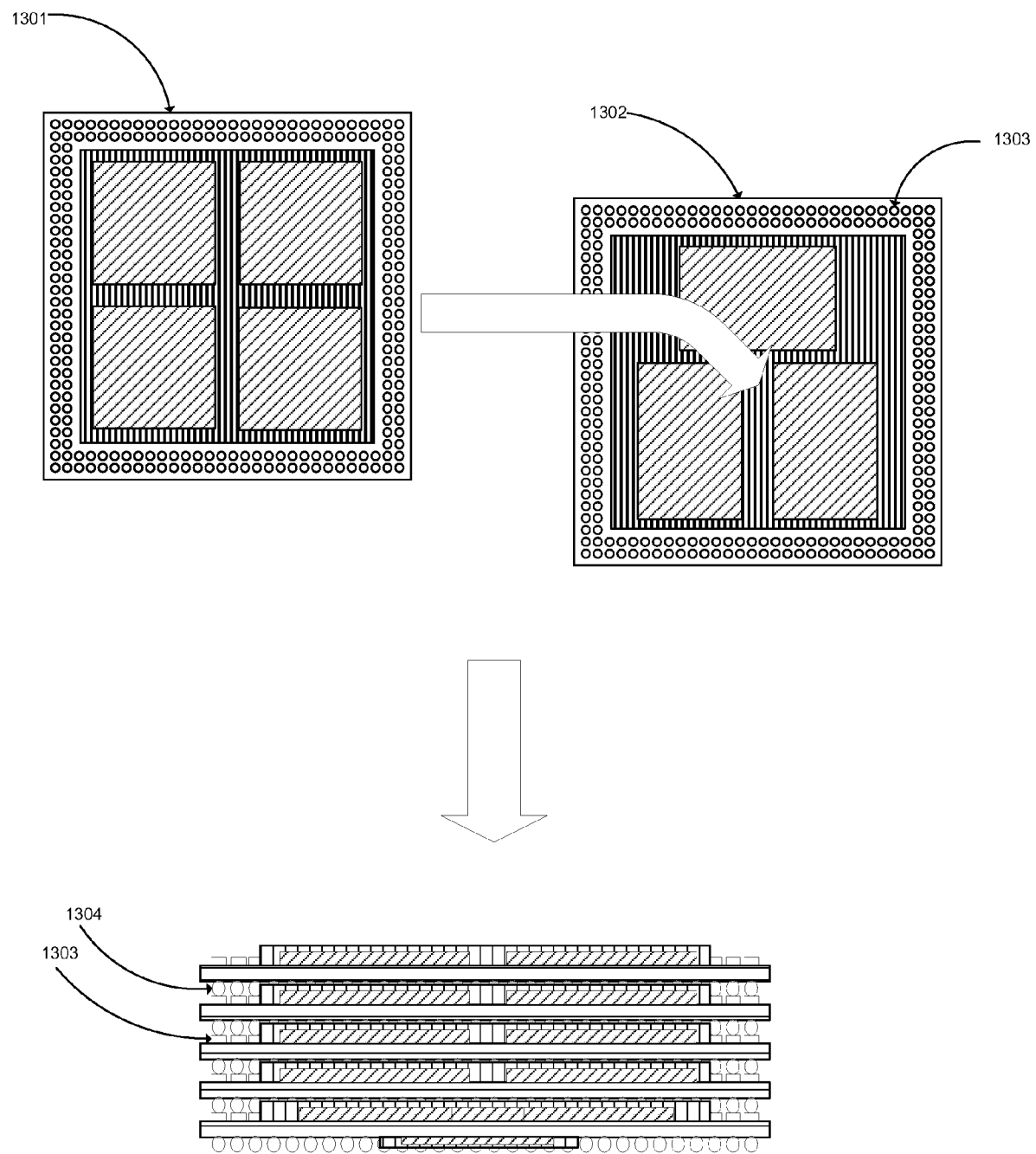
FIG. 13 depicts the low-end controller module configuration with stacked flash module according to an example embodiment of the present invention. The figure also shows how the balls have corresponding pads for inter-module connection.

FIG. 13 shows the stacking of the flash module 1301 and the first low-end type of controller module 1302. A single or stacked flash module can be placed on top of the controller module. The pads for the flash module interface 1303 must align with the flash module balls 1304. This configuration is for low capacity low performance applications. The number of flash modules to be stacked depends on the desired capacity and is limited to the supported feature of the main controller-processor. The main controller-processor's flash interface can support a maximum of 8 buses and a maximum of 8 flash devices per bus.

Figure 14:
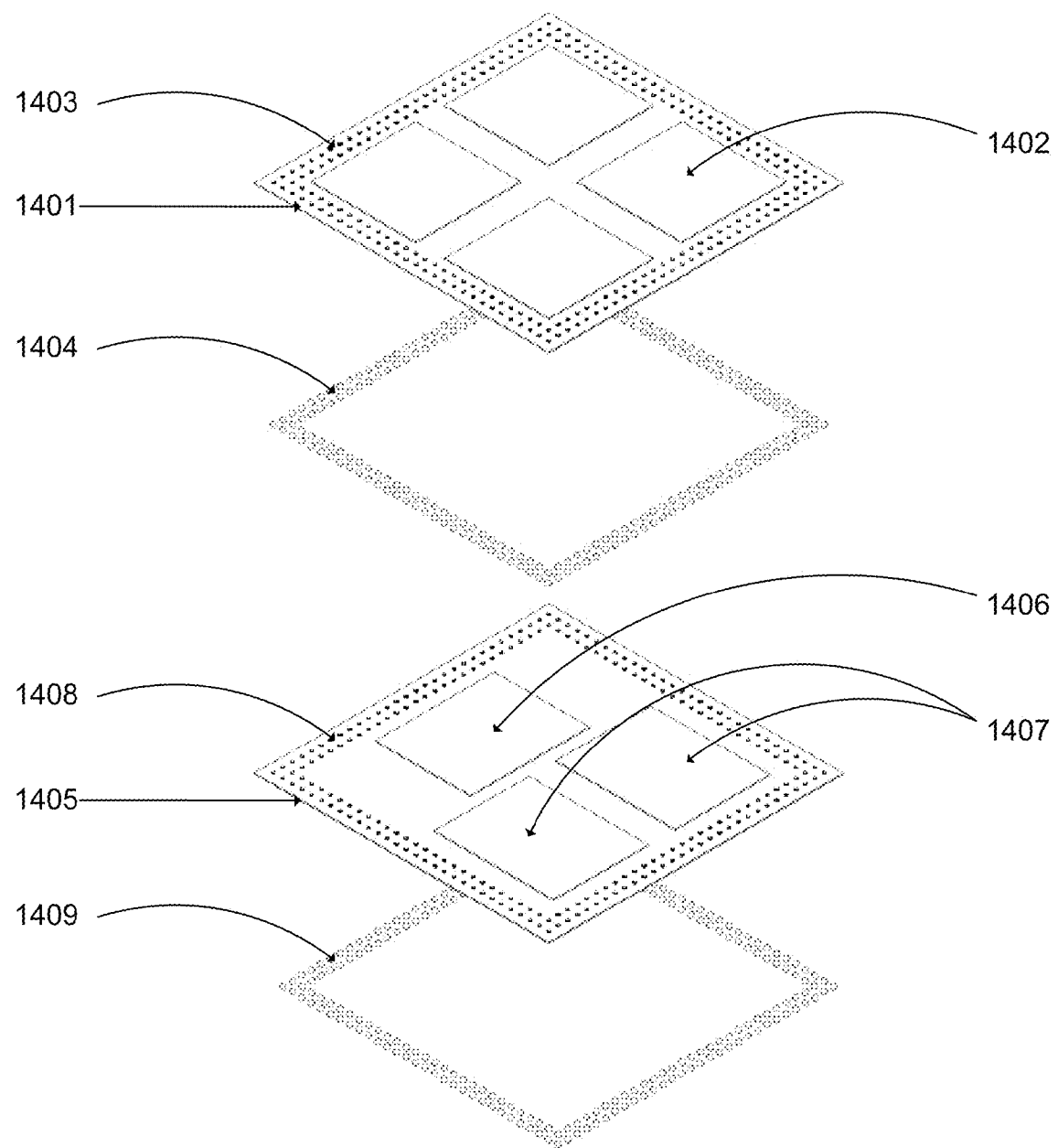
FIG. 14 is an isometric exploded version of the stacking technique presented in FIG. 11 according to an example embodiment of the present invention.
Figure 15A:
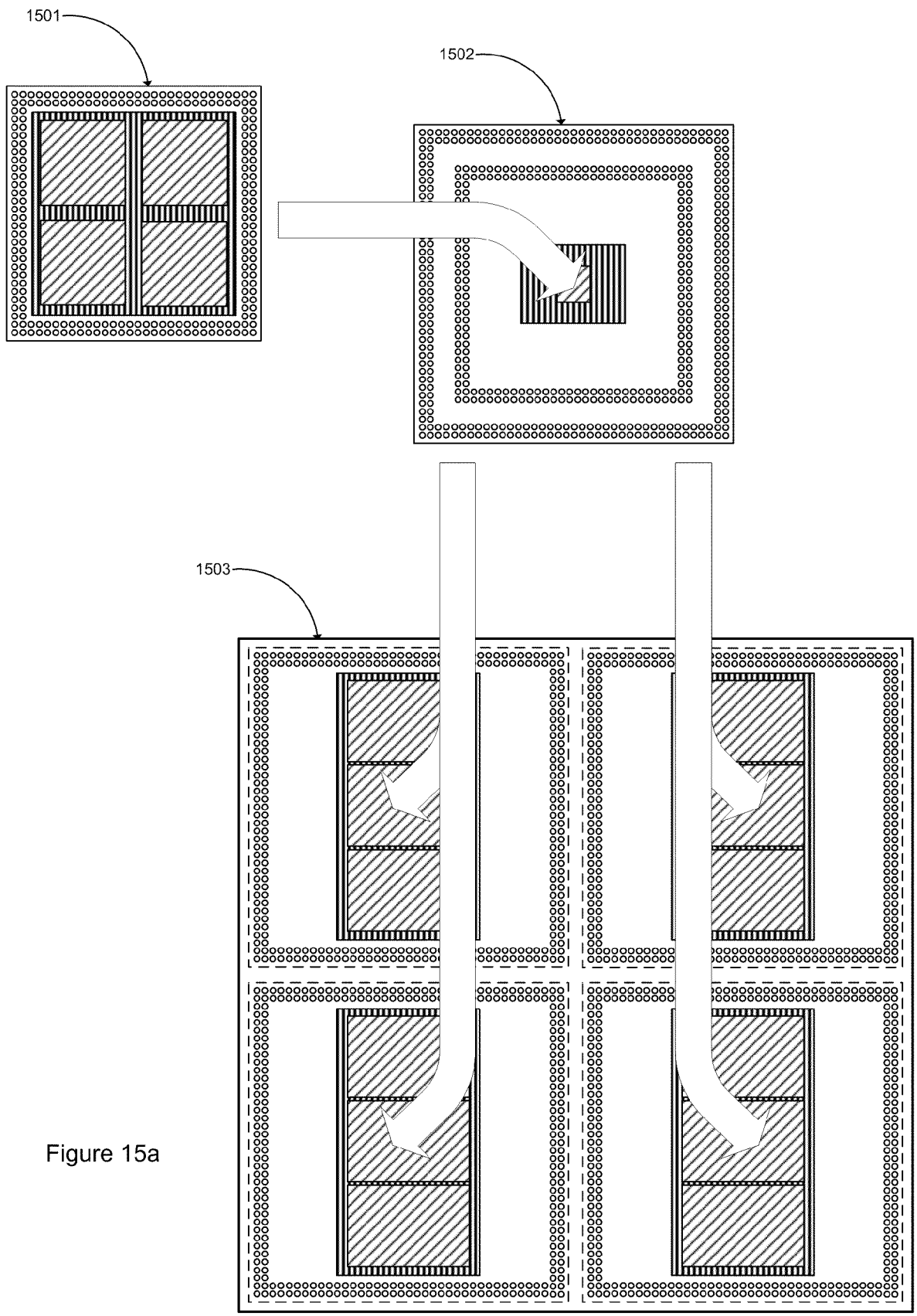
FIG. 15a, 15b depict the second high-end controller module configuration with stacked memory modules according to an example embodiment of the present invention. The figures also show how the balls have corresponding pads for inter-module connection.
Figure 15B:
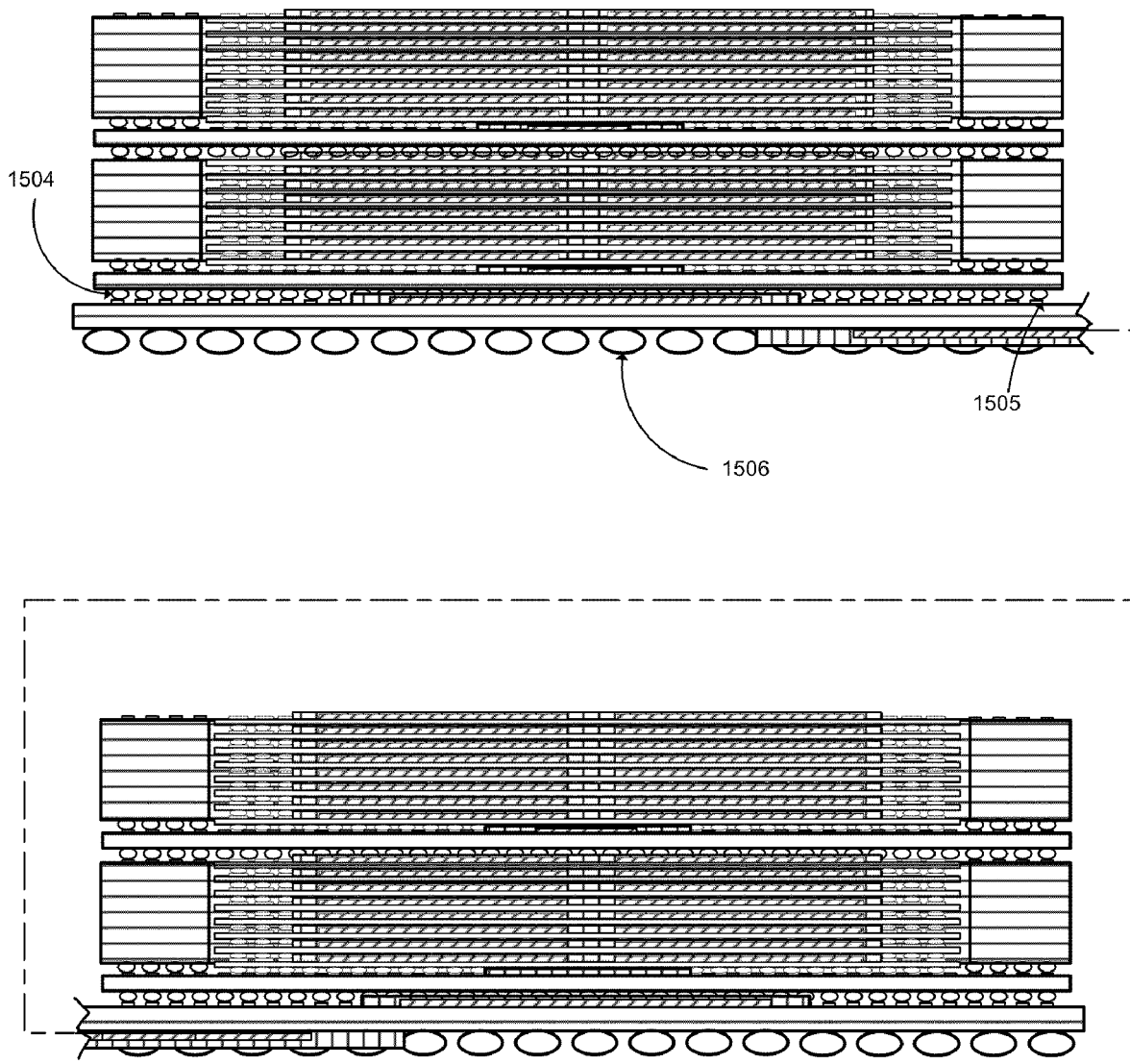

FIG. 14 shows the isometric and exploded drawing of the stacking technique for the first low-end controller configuration. Pins are assigned strategically and modules are stacked to make possible the miniaturization of the entire system in a package.
1401—The Flash Module
1402—The Flash Die
1403—The Flash Module Pad Interface to other Flash Modules
1404—The Flash Module Solder Balls
1405—The Controller Module
1406—The FPROM Die and the Main Controller-Processor Die at the bottom
1407—The SDRAM Die
1408—The Controller Module Pad Interface to the Flash Modules
1409—The Controller Module Solder Balls FIG. 15a shows the stacking technique for the second high-end controller configuration. The stacked flash modules 1501 are further stacked on top of the memory modules 1502 which are then mounted on the controller module 1503 on four different locations. Four memory modules can be mounted on four different locations on the controller module creating a memory set. Stacking more memory sets increases the total capacity. The cross-sectional representation of the said stacking technique is shown in FIG. 15b. The memory module balls 1504 must align to the pad interface 1505 on the controller module. As previously discussed in FIG. 11, fillers are used to physically connect two successively stacked modules. The controller balls 1506 will become the external interface to the main board. The final package is 4× bigger than the first high end option.

Figure 16:
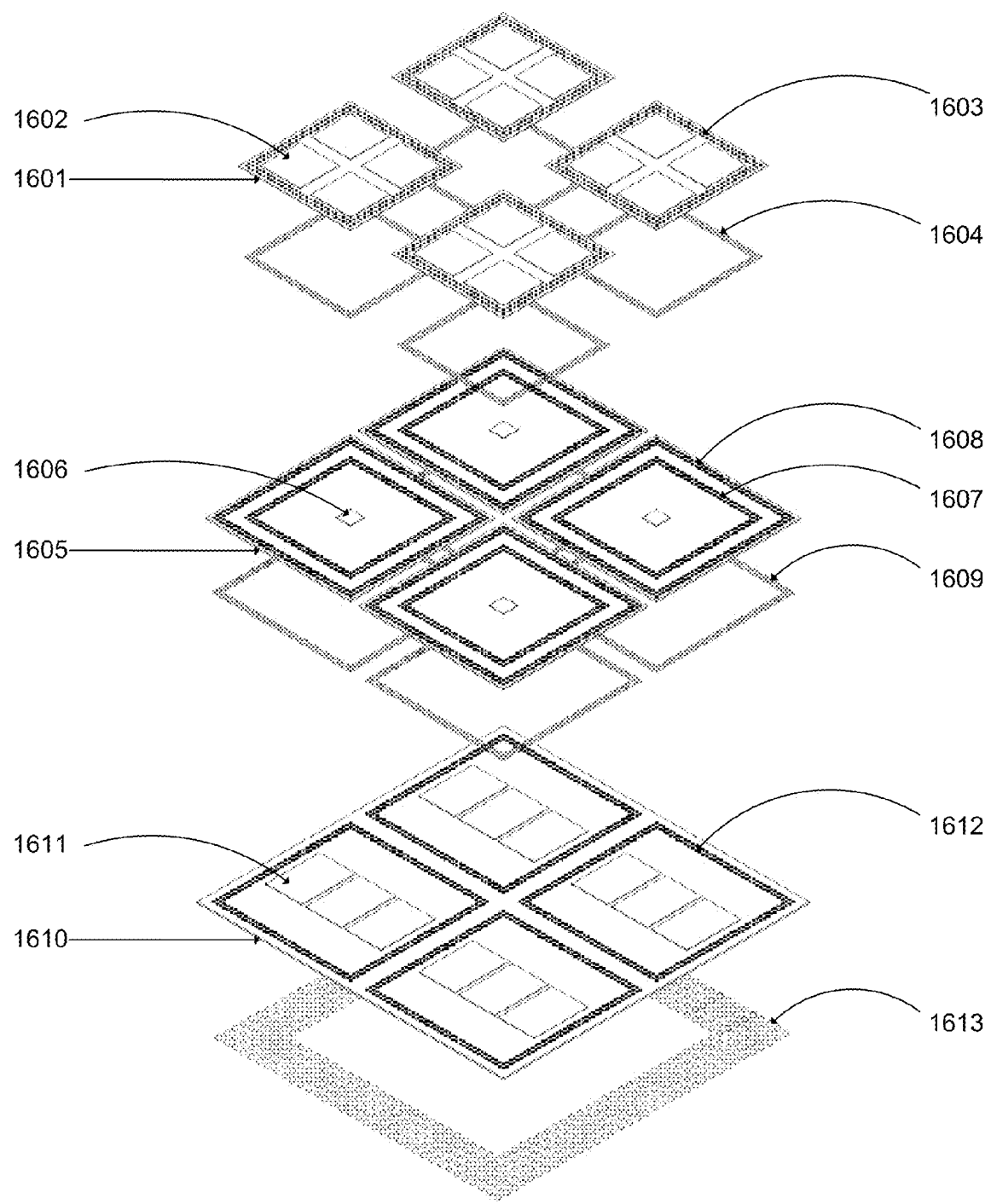
FIG. 16 is an isometric exploded version of the stacking technique presented in FIG. 14 according to an example embodiment of the present invention.
Figure 17A:
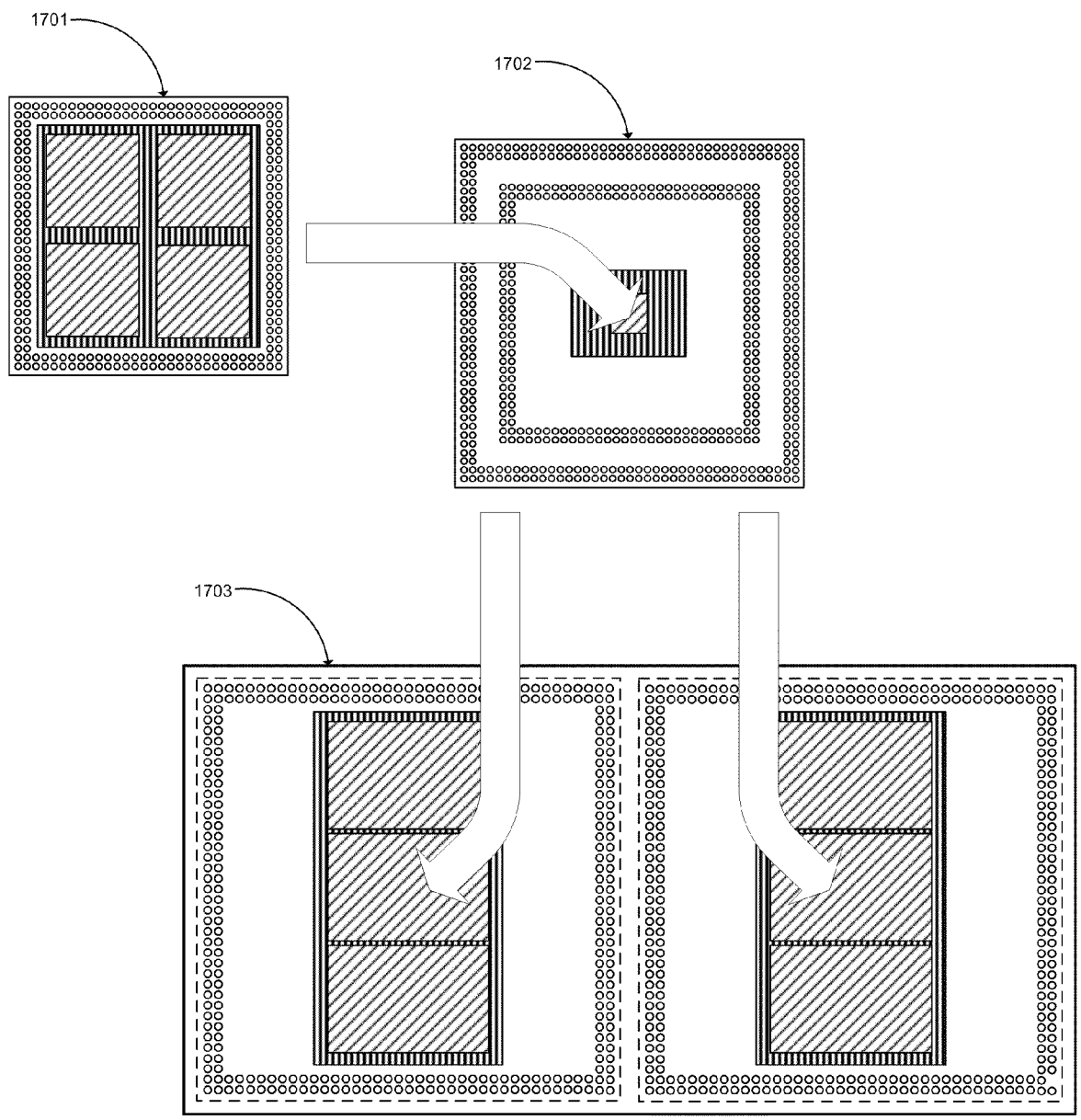
FIG. 17a, 17b depict the second low-end controller module configuration with stacked memory modules according to an example embodiment of the present invention. The figures also show how the balls have corresponding pads for inter-module connection.
Figure 17B:
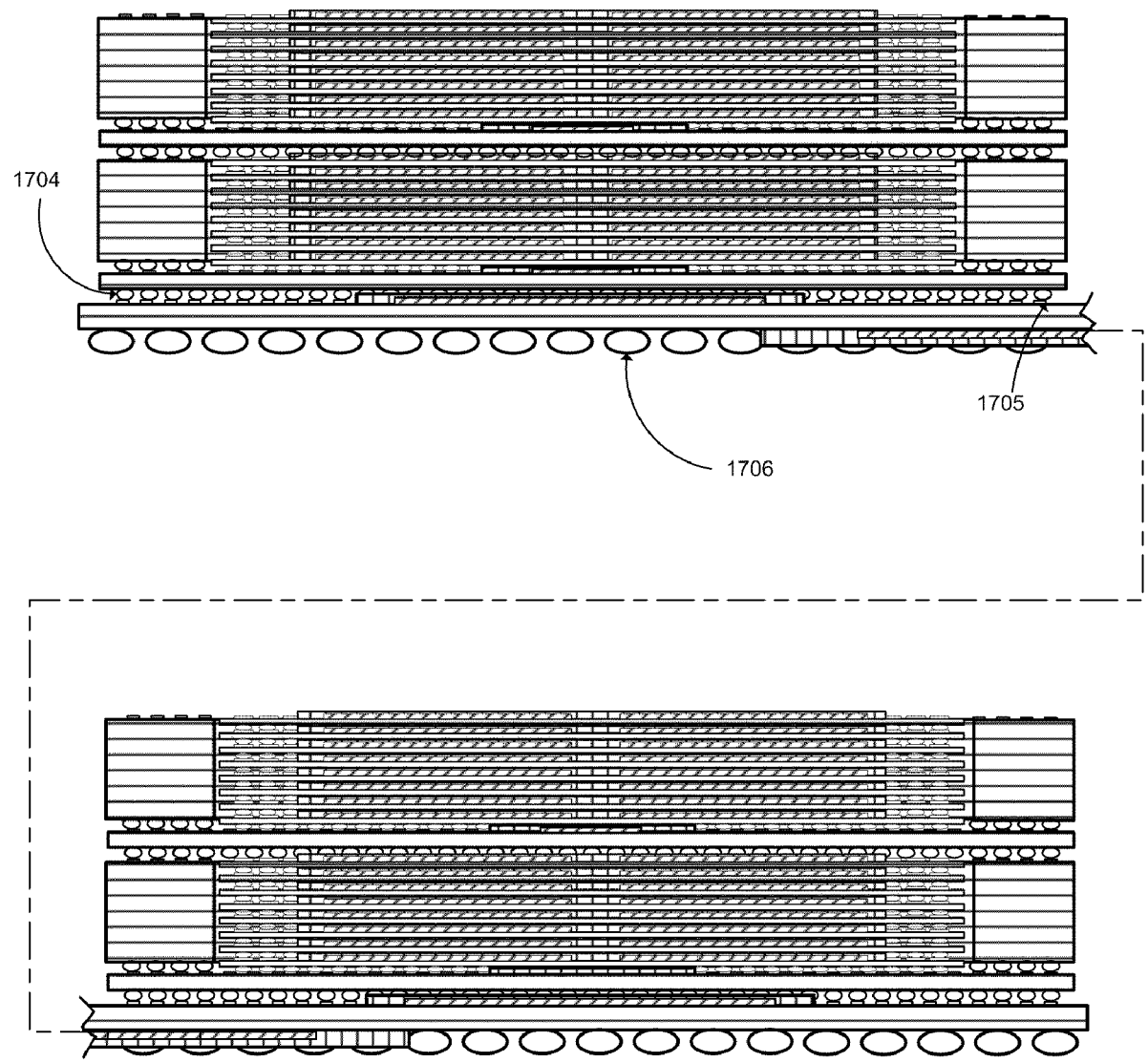

FIG. 16 shows the isometric and exploded drawing of the stacking technique discussed in FIG. 15. Pins are assigned strategically and modules stacked to make possible the maximum stacking and interconnection between modules. As previously discussed in FIG. 11, fillers are used to physically connect two stacked successively stacked modules.
1601—The Flash Module
1602—The Flash Dies
1603—The Flash Module Pads Interface to other Flash Modules
1604—The Flash Module Solder Balls
1605—The Memory Module
1606—The Flash Interface Controller Dies
1607—The Memory Module Pad Interface to Flash Modules
1608—The Memory Module Pad Interface to other Memory Modules
1609—The Memory Module Solder Balls
1610—The Controller Module
1611—The SDRAM Dies on top side and the FPROM and Main Controller-Processor at the bottom side
1612—The Controller Module Pads Interface to the Memory Modules
1613—The Controller Module Solder Balls FIG. 17a shows the stacking technique for the second low-end configuration. The stacked flash modules 1701 are further stacked on top of the memory modules 1702 which are then mounted on the controller module 1703 on two different locations. This technique can use both internal and external flash interface controller configurations, making this technique flexible. The cross-sectional view is shown in FIG. 17b. The memory module balls 1704 must align to the pad interface 1705 on the controller module. The controller balls 1706 will become the external interface to the main board. The final package is twice the size of the first high end option.

Figure 18:
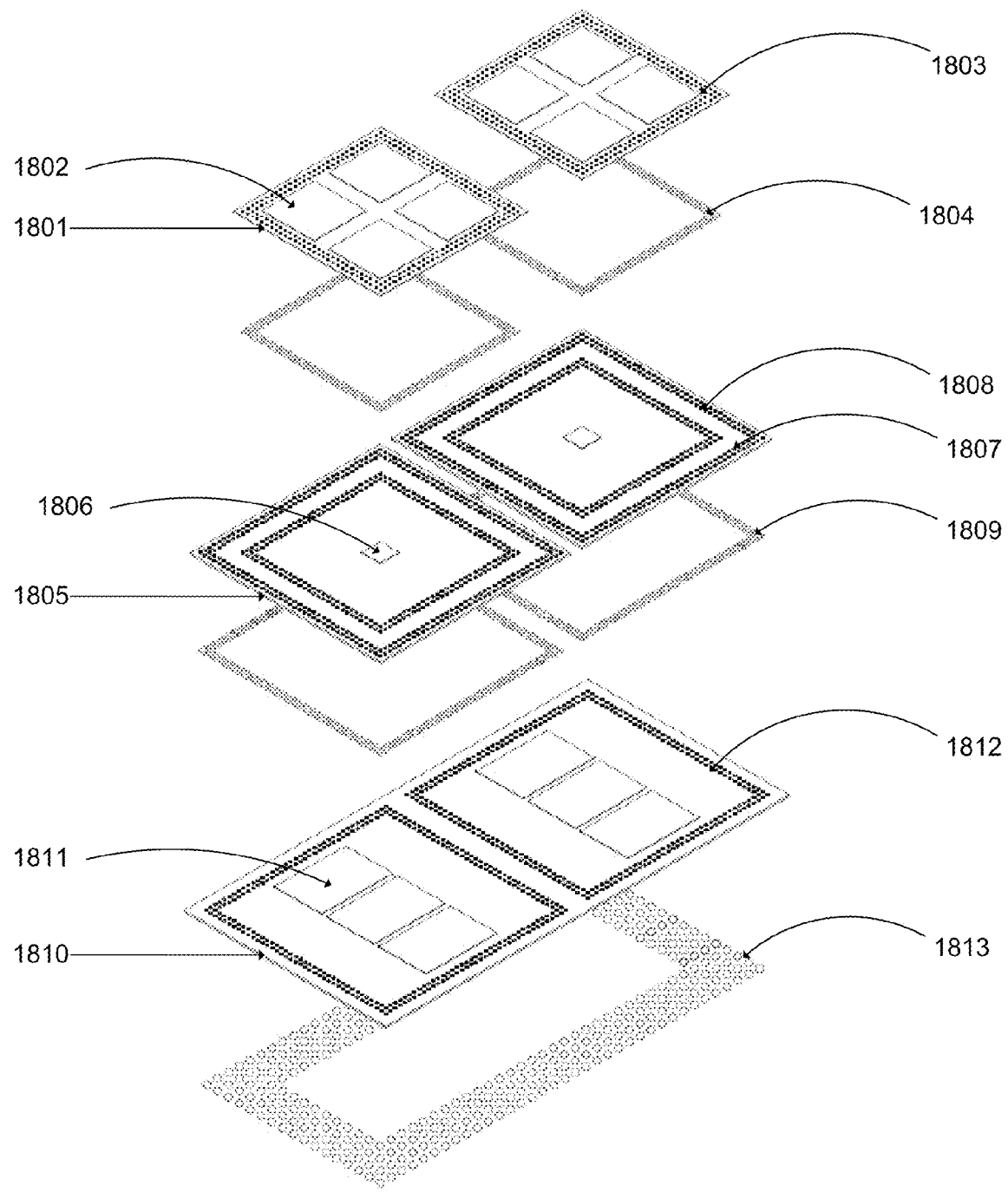
FIG. 18 is an isometric exploded version of the stacking technique presented in FIG. 17 according to an example embodiment of the present invention.

FIG. 18 shows the isometric and exploded drawing of the stacking technique discussed in FIG. 17. Pins are assigned strategically and modules stacked to make possible the maximum stacking and interconnection between modules. As previously discussed in FIG. 11, fillers are used to physically connect two stacked successively stacked modules.
1801—The Flash Module
1802—The Flash Dies
1803—The Flash Module Pads Interface to other Flash Modules
1804—The Flash Module Solder Balls
1805—The Memory Module
1806—The Flash Interface Controller Dies
1807—The Memory Module Pad Interface to Flash Modules
1808—The Memory Module Pad Interface to other Memory Modules
1809—The Memory Module Solder Balls
1810—The Controller Module
1811—The SDRAM Dies on top side and the FPROM and Main Controller-Processor at the bottom side
1812—The Controller Module Pads Interface to the Memory Modules
1813—The Controller Module Solder Balls A more detailed technique on how the pins are assigned and how modules are placed with different orientation in the stack is discussed in the following paragraphs.

Figure 19:
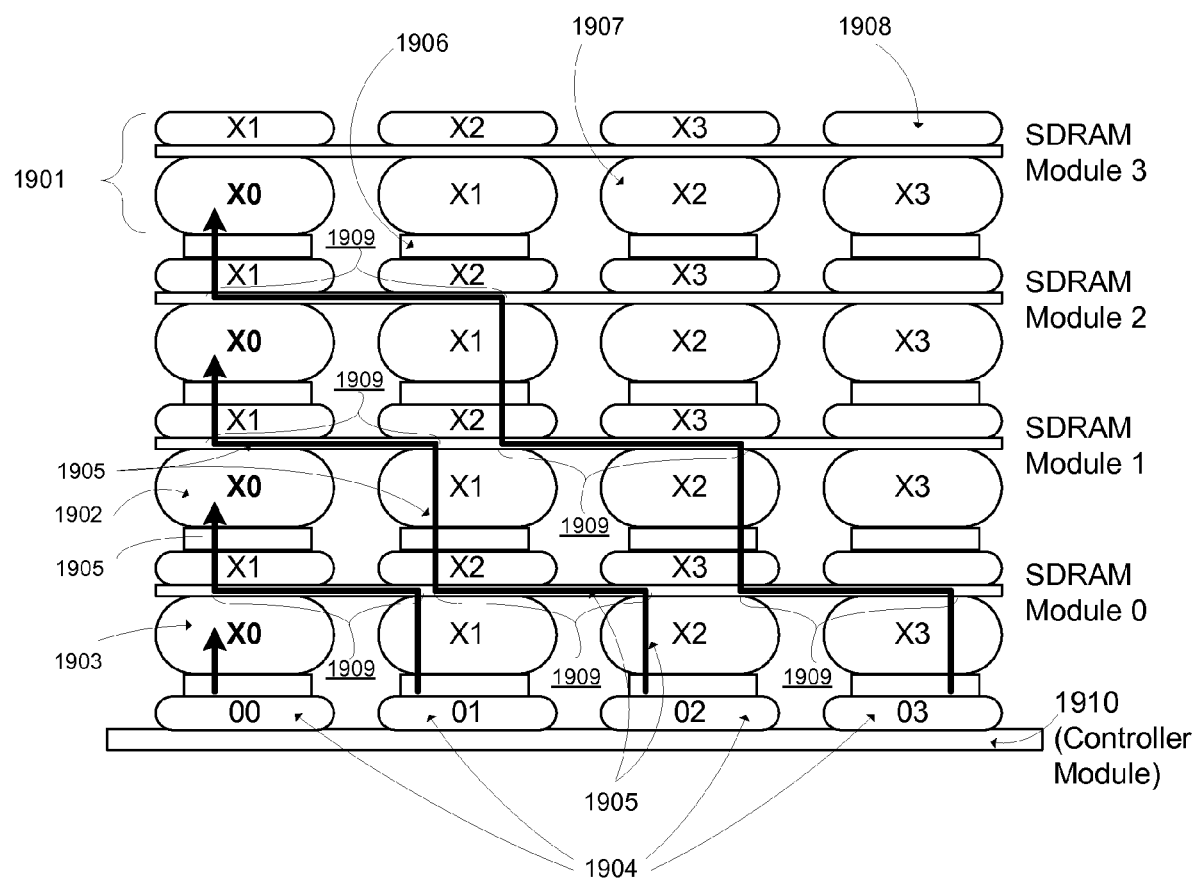
FIG. 19 shows a pin assignment and connection technique to be able to select specific layer in a multi-stacked module according to an example embodiment of the present invention.

FIG. 19 shows a first pin assignment and connection technique that enables a selection of specific module in a multiple module stack. The figure illustrates the controller and SDRAM modules as an example. The SDRAM module balls, such as 1907, are represented by big oblong shapes, and the pads such as 1908 are represented by smaller oblong shapes. A pad to ball connection is represented by a rectangle, such as

1906. The controller module has four active pads such as 1904, one each for the four SDRAM modules such as 1901. The controller module's active pad 00 1904 is connected to SDRAM module 0's X0 ball 1903, pad 01 to SDRAM module 1's X0 ball 1902, and so on. The X0 balls are the active balls for the SDRAM modules. All SDRAM modules are identical which include the connections as follows: X1 ball is connected to X1 pad, X2 ball to X2 pad, and so on. The technique involves using a ladder-like routing path, such as 1905 on the stacked modules. This technique enables the controller module's active pad to be routed to the desired specific module in the stack. The example embodiment illustrated in FIG. 19 comprises a repeating pattern for the balls and pads. Passive balls are connected within each module to passive pads with an offset distance equaling one periodic distance of the repeating pattern. The importance is the approach using repeating pattern and offsetting of the passive ball to passive pad within each module, other offset distances can be used also in other embodiment of the present invention, e.g. using an offset of two or any multiple of the periodic distance of the repeating pattern. The example embodiment does not limit the scope of the present invention.

Figure 20A:
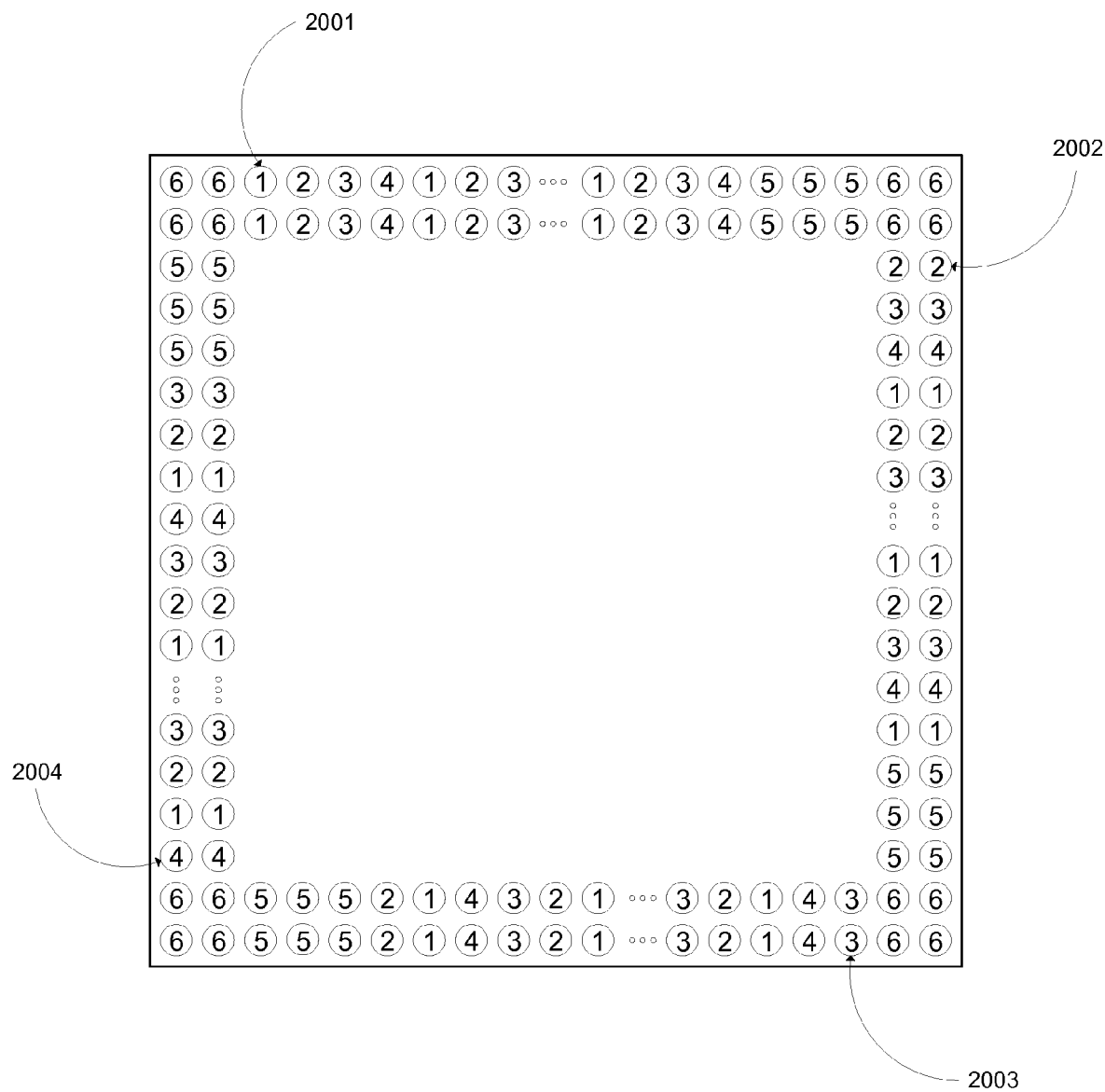
FIG. 20a shows another pin assignment technique which uses a rotational stacking orientation to allow stacking of four identical modules representing different bus interfaces according to an example embodiment of the present invention.
Figure 21A:
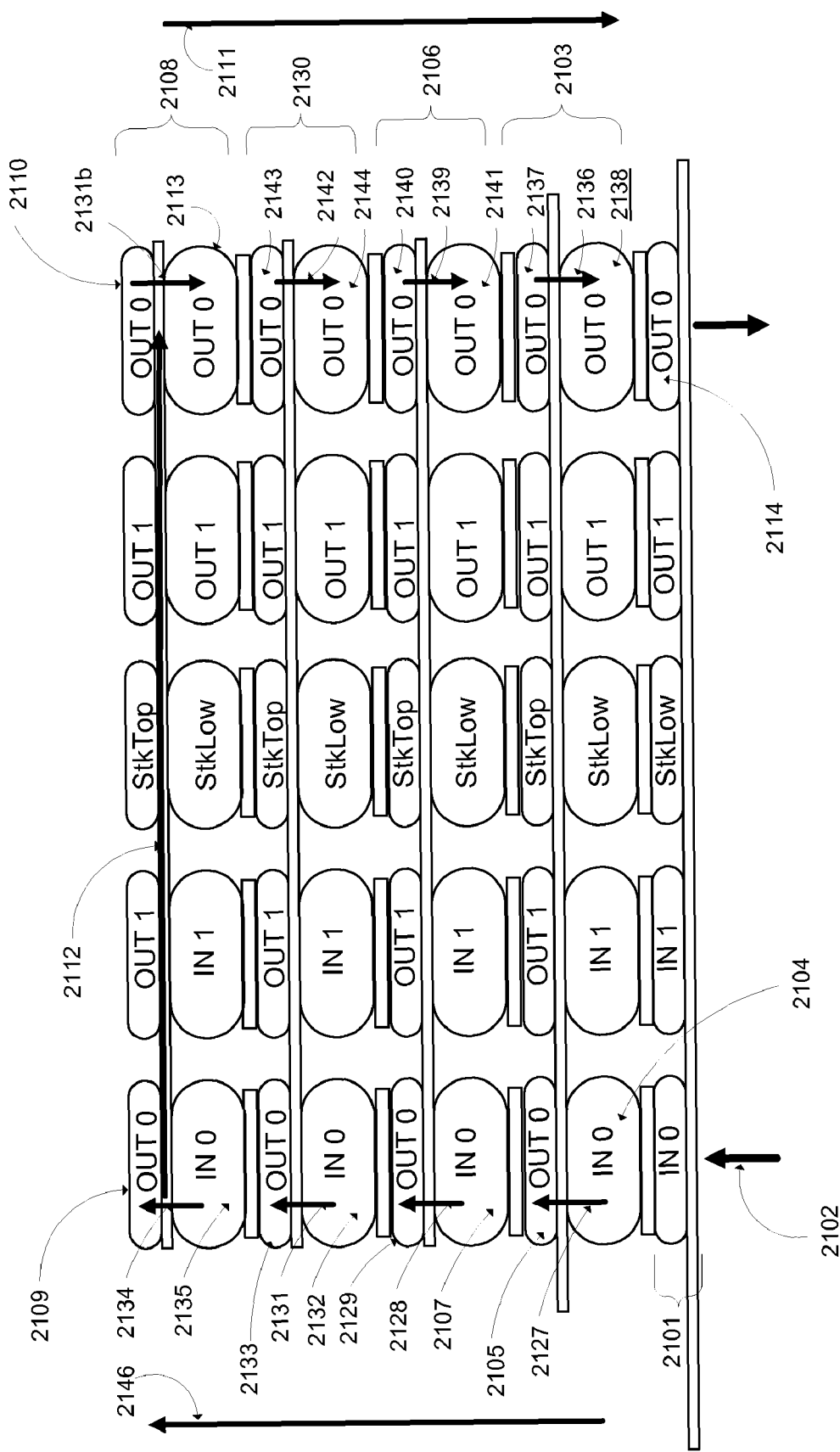
FIG. 21a shows another pin assignment and connection technique to be able to connect a serial chain route from multiple modules in a stack according to an example embodiment of the present invention.

Another pin assignment, connection, and stacking combo method introduced in this invention is the rotational stacking technique. FIG. 20*a* shows the pad interconnects for a certain base module and strategic numbering is assigned. Pads labeled with numbers 1 to 4 represent the four different groups of signals. Pads labeled with the number 5 are used for the vertical stacking IOs (more details are illustrated in FIG. 21*a*). Pads labeled with the number 6 are reserved for power and ground which are common to all modules in the stack. Since the stacked modules are identical, we can use rotational stacking to connect one module to one group of signals and the following rotated stacked module connects to another group of signals, and so on. This way ensures four identical modules to be stacked and connected to four different groups of signals from the base module which is typically a controller. Pad 1 2001, upon the substrate being rotated 90 degrees clockwise, occupies pad 2 2002 location relative to an unrotated substrate such as the base substrate which is typically a controller. In a similar manner pad 1 2001 can be located at pad 3 2003 location, then pad 4 2004 location upon the substrate being rotated 180 and 270 degrees clockwise respectively.

Figure 20B:
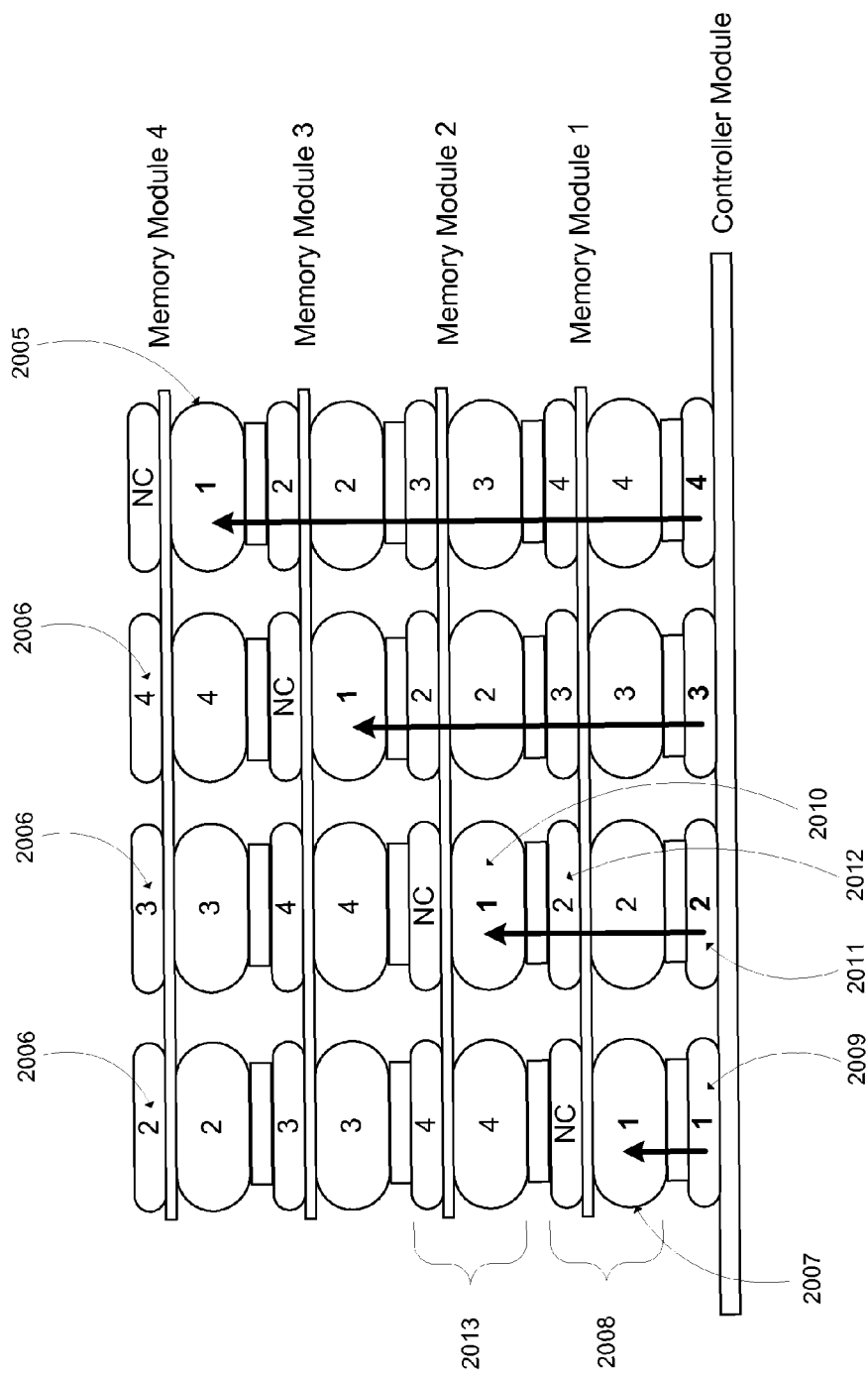
FIG. 20b shows a cross-section representation of the four stacked modules on a rotational stacking technique and how their pins mates according to an example embodiment of the present invention.

FIG. 20*b* shows a cross-sectional view of four such modules stacked over the base module. Memory and Controller modules are used as example. Pin 1s such as 2005 on the stacked modules are the only active signal pins for the module. The rest (numbered 2 to 4) 2006 are directly connected to the balls underneath them but have no other connections. This way connection is continued from bottom to top. The active pin 2007 of the first module 2008 is aligned to pin 1 pad 2009 on the base module, and the second module's active pin 2010 is aligned on pin 2 2011 of the base module with second module being rotated 90 degrees clockwise. Since pin 2 2012 on the first module is directly connected to the ball underneath, this allows the pin 1 on the second module 2013 to be connected to pin 2 2011 of the base module. Rotating the next stacked module 90 degrees more, will align it's active pin to the base module pin 3 and so on until the forth rotation.

Figure 21B:
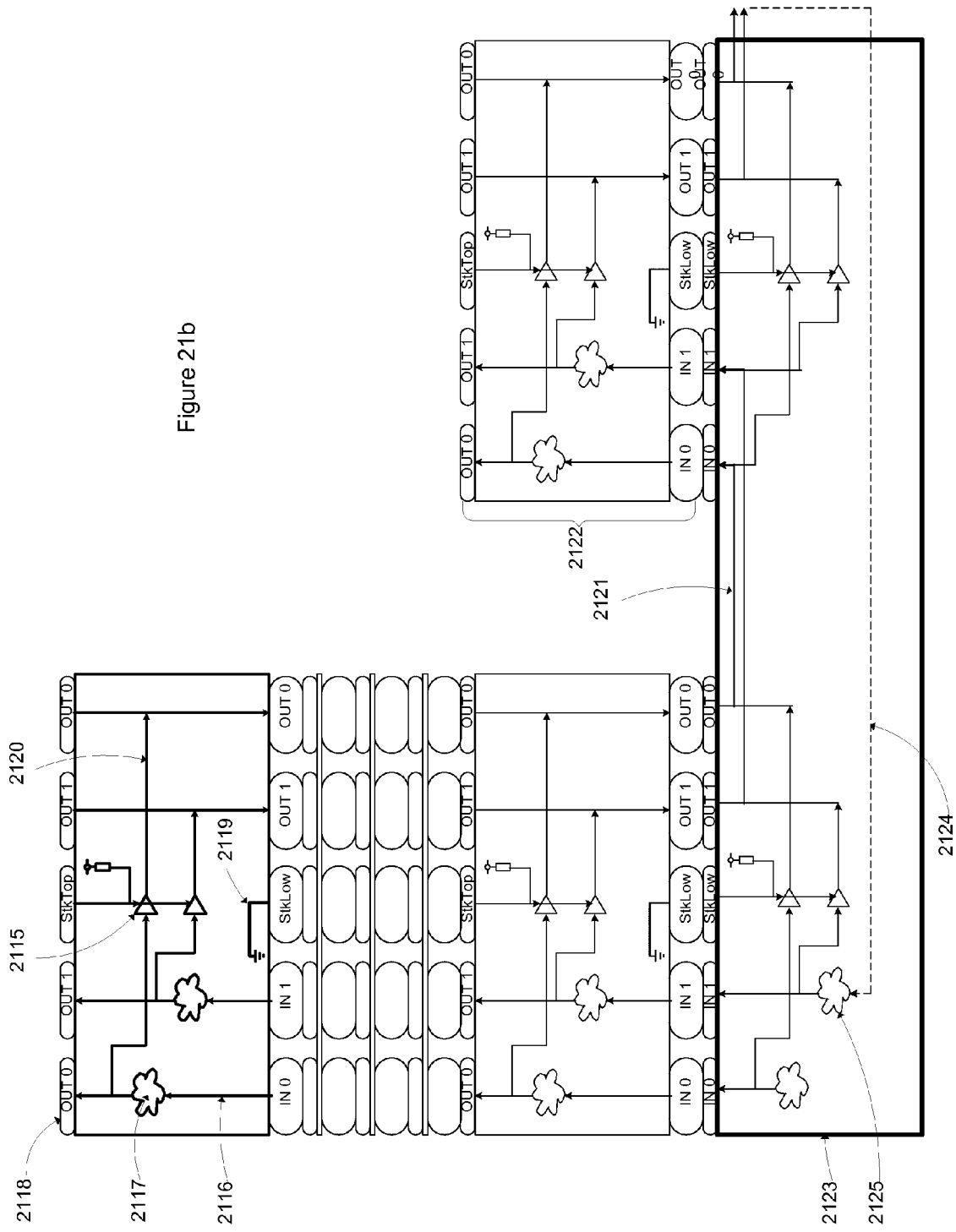
FIG. 21b shows the routing of a serial chain connection from one stack location to another allowing application of both vertical and horizontal expansion independently or simultaneously according to an example embodiment of the present invention.

The last connection technique is used for serial routing of all modules in the stack and allowing them to be externally accessible for horizontal expansion on a PCB, such as a main board. FIG. 21*a* shows how this technique is implemented in the stacking method. The main board 2101 contains the input signals 2102 which will then be connected to IN ball 2104 of the base module 2103. The base module's OUT pad 2105 is connected to IN ball 2107 of the first stack module 2106, and so on. The top module 2108 terminates the signal to the top pad 2109 and routes, with connection 2112, the signal internally to another pad 2110 which is connected directly to the ball 2113 underneath. Since the modules are identical, this routed signal passes through the pads and balls 2111 of the stack until it reaches the OUT pad 2114 of the main board for external access. How the top module terminates the serial chain and branches them out to other pads is shown in FIG. 21*b*. All modules have a selectable buffer 2115 that tri-states the input when pulled low. The signal from the IN balls 2116 enters the internal circuit 2117 and exits the circuit connecting to the OUT pad 2118. The buffer's 2115 control line is weakly pulled up internally. The "StkLow" ball is connected internally to GND 2119, thus pulling down the buffer control line when a module is stacked above it, and it is pulled up when no module is stacked directly above it. When the buffer control line is pulled high, it will let the input signal branch out 2120 to the other pads, thus creating a connection route or trace that loops back to the base module solder balls. When a module is stacked above a module that is disposed with selectable buffer 2115 in the manner shown, the buffer control signal is pulled low, tri-stating the input signal and disallowing the branching effect. This technique allows the signal to be accessible to the external balls of the base module, thus horizontal expansion for a serial signal is achievable. The balls are then routed, with connection 2121, to the other modules 2122 on the other locations. The same technique is used on the main board 2123, when no package is detected on the "StkLow" pad, the buffer allows the input to connect to the designated pads on the other locations. The tri-stated buffer technique is redundant to all locations. An example is the JTAG TDI-TDO signal. The diver circuit 2125 sends out TDI signals to the pads and the closing TDO signal 2124 loops back to the driver circuit.

Combining these stacking, pin assigning and connection techniques allow interconnection between modules with both parallel and series signals to both vertical and horizontal expansion. The technique is very flexible depending on the specific application, capacity, board size and height limit.

We claim:

1. A stacked module comprising a plurality of modules each comprising:
   one or more active ports for carrying one or more active signal;
   one or more passive ports for passing through the one or more active signals;
   a first serial chain route that includes at least one serial chain connection, the serial chain connection including: a serial chain circuit, a serial chain input, and serial chain output; said serial chain input coupled to said serial chain output through said serial chain circuit;
   a second serial chain route and a control circuit for enabling a routing path that connects the first serial chain route with the second serial chain route within an end module; and
   said control circuit is disposed to enable the routing path in response to a control input signal received from another module from the plurality of modules when the end module is coupled to the another module.

2. The stacked module of claim 1 wherein the one or more passive port forms a ladder like routing path, and the passive port connects a passive ball on one surface of a module to a passive pad on another surface of the module.

3. The stacked module of claim 2:
   wherein each of the plurality of modules comprises a first side and a second side;

wherein the one or more active port is connected to one or more active ball on the first side of one or more corresponding module;

wherein the one or more passive port is connected to one or more passive ball on the first side and one or more passive pad on the second side of one or more corresponding module;

wherein each of the one or more passive ball and each of the one or more passive pad connected to a same passive port are located between a pre-determined distance to each other in a repeating pattern, the pre-determined distance equaling a multiple of a periodic distance of the repeating pattern;

wherein one or more active port of a base module is routed to a same location on one or more modules through the ladder like routing path; and wherein at least one of the one or more passive ball and one or more passive pad forms a ladder like routing path.

4. The stacked module of claim 2, wherein:

the stacked module further includes a first outside surface and a second outside surface, the first and second outside surfaces disposed to face opposite each other; and at least one of the plurality of modules includes a first module having a first target location terminating between the first and second outside surfaces.

5. The stacked module of claim 4, wherein the plurality of modules further includes a second module and a third module, the second module including a second module surface that includes the first outside surface and the third module including a third module surface that includes the second outside surface.

6. The stacked module of claim 2, further including a second ladder like routing path; and wherein:

the plurality of modules includes a first module and a second module, the first and second modules respectively including a first target location and a second target location, the second target location located within the stacked module; and the ladder like routing path for routing one of the active port to the first target location, and the second ladder like routing path for routing another one of the active port to the second target location.

7. The stacked module of claim 6, further including a second ladder like routing path; and wherein:

the stacked module includes a first outside surface and a second outside surface, the first and second outside surfaces disposed to face opposite each other;

the ladder like routing path terminates at the first target location; and the second ladder like routing path terminates at the second target location, the second target terminating within the stacked module and located between the first and second outside surfaces.

8. The stacked module of claim 6, wherein the second target location is located between the first and second outside surfaces.

9. The stacked module of claim 1 wherein one or more of the plurality of modules is rotated before being stacked and the one or more passive port forms a rotational routing path.

10. The stacked module of claim 9:

wherein each of the plurality of modules comprises a first side and a second side;

wherein the one or more active port is connected to one or more active ball on the first side of one or more corresponding module;

wherein the one or more passive port is connected to one or more passive ball on the first side and one or more passive pad on the second side of one or more corresponding module;

wherein each of the one or more passive ball and each of the one or more passive pad connected to a same passive port are located opposite each other in a repeating pattern;

wherein one or more active port of a base module is routed to a same location on one or more modules through the rotational routing path; and wherein at least one of the one or more passive ball and one or more passive pad form a rotational routing path.

11. The stacked module of claim 1 wherein one or more of the plurality of modules includes a main board.

12. The stacked module of claim 11 wherein one or more vertically stacked module is connected to the main board.

13. The stacked module of claim 1:

wherein each of the plurality of modules comprises a first side and a second side, and the one or more passive ports includes a first passive port connected to a passive ball disposed on the first side and to a passive pad disposed on the second side of a module from the plurality of modules;

wherein the serial chain input includes the passive ball and the serial chain output includes the passive pad wherein the passive ball and the passive pad are located opposite each other; and further including a base module having an active port for providing a signal, said signal routed to a same location on the plurality of modules through the first serial chain route.

14. The stacked module of claim 1:

wherein the routing path includes one or more tri-state driver controlled by the control circuit.

15. The stacked module of claim 14 further including:

a main board coupled to another stacked module having a third serial chain route; and another control circuit for enabling another routing path that connects the second serial chain route with the third serial chain route.

* * * * *